United States Patent [19]
Mizutani et al.

[11] Patent Number: 5,569,929
[45] Date of Patent: Oct. 29, 1996

[54] DOUBLE-BEAM LIGHT SOURCE APPARATUS, POSITION DETECTING APPARATUS AND ALIGNING APPARATUS

[75] Inventors: Hideo Mizutani, Yokohama; Kazuya Ota, Setagaya-ku, both of Japan

[73] Assignee: Nikon Corporation, Japan

[21] Appl. No.: 470,889

[22] Filed: Jun. 6, 1995

Related U.S. Application Data

[62] Division of Ser. No. 91,501, Jul. 14, 1993, Pat. No. 5,488,230.

[30] Foreign Application Priority Data

| Jul. 15, 1992 | [JP] | Japan | 4-187198 |
| Feb. 12, 1993 | [JP] | Japan | 5-024441 |
| Feb. 19, 1993 | [JP] | Japan | 5-029530 |
| Feb. 19, 1993 | [JP] | Japan | 5-029531 |

[51] Int. Cl.⁶ .......... G01N 21/86; G06K 7/015; G01B 11/00
[52] U.S. Cl. .......... 250/548; 250/557; 356/400; 356/401
[58] Field of Search .......... 356/400, 401, 356/363, 349, 354; 250/548, 557

[56] References Cited

U.S. PATENT DOCUMENTS

| 4,110,016 | 8/1978 | Berg et al. | 350/306 |
| 4,281,904 | 8/1981 | Sprague et al. | 359/263 |
| 4,918,699 | 4/1990 | Boyd et al. | 356/349 |
| 5,070,250 | 12/1991 | Komatsu et al. | 250/548 |
| 5,369,489 | 11/1994 | Somekh | 356/349 |
| 5,394,240 | 2/1995 | Matsumoto | 356/349 |

Primary Examiner—William L. Sikes
Assistant Examiner—Tiep H. Nguyen
Attorney, Agent, or Firm—Pennie & Edmonds

[57] ABSTRACT

A position detecting apparatus comprises a double-beam producing device for producing two beams different in frequency from each other, which are guided to irradiate a diffraction grating on an object to be inspected in two predetermined directions, and a detector photoelectrically detecting through an objective optical system diffracted light produced by the diffraction grating, in which the double-beam producing device comprises a light source for supplying a beam of a single wavelength or multiple wavelengths, a beam splitting device for splitting the beam from the light source into two predetermined beams, a relay optical system for converging the two split beams at a predetermined position, and a frequency difference producing device disposed at or near a converging position by the relay optical system, for producing a predetermined frequency difference between the two split beams.

18 Claims, 19 Drawing Sheets

DOUBLE-BEAM LIGHT SOURCE APPARATUS, POSITION DETECTING APPARATUS AND ALIGNING APPARATUS

This is a division of application Ser. No. 08/091,501, filed Jul. 14, 1993, now U.S. Pat. No. 5,488,230.

BACKGROUND OF THE INVENTION

1. Field of the Invention

The present invention relates to a double-beam light source apparatus suitable for position detection of heterodyne type and a position detecting apparatus of heterodyne type using the double-beam light source apparatus, and is suitably applicable specifically to a high-precision aligning apparatus for aligning a wafer or mask in semiconductor production equipment.

2. Related Background Art

Recently, projection exposure apparatus, which are so called steppers, are frequently used as apparatus for replication of fine pattern for example for semiconductor elements onto a wafer of semiconductor at a high resolution. In particular, since a recent demand is an increase in density of LSI produced by*such apparatus, a finer pattern is desired to be replicated onto a wafer. Higher precision positioning (alignment) is necessary-for replication of finer pattern.

For example, Japanese Laid-open Patent Application No. 62-261003 discloses an apparatus for carrying out high-precision position detection using the heterodyne interference method.

This apparatus utilizes a Zeeman laser, which emits a beam including P-polarized light and S-polarized light having respective frequencies slightly different from each other, as a light source for alignment, in which the beam from the Zeeman laser is split by a polarized beam splitter into P-polarized light of frequency $f_1$ and S-polarized light of frequency $f_2$ and the thus split beams are guided via a reflection mirror to irradiate a diffraction grating mark (alignment mark) formed on a reticle (mask) in two predetermined directions. A transparent window is provided at a position adjacent to the diffraction grating mark on the reticle, through which a part of the beams impinging on the diffraction grating mark pass to irradiate a diffraction grating mark formed on a wafer in two predetermined directions.

When the two beams different in frequency from each other thus irradiate the diffraction grating marks respectively in the two directions, diffracted light from each diffraction grating mark is made to pass through a polarizer in detection system as to interfere with each other, whereby two optical beat signals are obtained by photoelectric conversion of interference light by respective photoelectric detectors. A relative phase difference between the two signals corresponds to a deviation amount between the two beams crossing each other on diffraction grating marks and the substrate (reticle or wafer). For example, with a reference signal, which is either one of the optical beat signals detected, the reticle is relatively moved to the wafer such that the phase difference becomes zero or a certain value, whereby high-precision position detection is carried out.

It is, however, difficult for the position detecting apparatus disclosed in Japanese Laid-open Patent Application No. 62-261003 to perfectly separate the P-polarized light from the S-polarized light. For example, the beam of frequency $f_2$ could be mixed in the beam of frequency $f_1$ originally expected to be pure to irradiate the diffraction grating marks, which results in degrading the SN ratio of optical beat signals obtained. The degradation of SN ratio raises a problem of lowering the detection precision.

Japanese Laid-open Patent Application No. 2-227604 discloses another position detecting apparatus which can perform position detection at excellent SN ratio, using the heterodyne interference method.

This apparatus is so arranged that a beam from laser source is split into two beams by a beam splitter and that one of the two split beams is made to pass through one of two different acousto-optic modulators (AOM) and the other beam through the other AOM, whereby the two beams have respective frequency differences different from each other. The two beams having the frequency differences different from each other irradiate diffraction grating-marks on reticle and on wafer respectively in two directions. Diffracted light components going out of the diffraction grating marks in the same direction are made interfered with each other. Two optical beat signals are obtained by photoelectric conversion of interference light by respective photoelectric detectors. Relative alignment is achieved at high precision between reticle and wafer using the two optical beat signals. As so arranged, the mixture of beams different in frequency can be avoided so as to enable detection with excellent SN ratio.

In the position detecting apparatus employing the heterodyne interference method as disclosed in above Japanese Laid-open Patent Application No. 2-227604 there are, however, used an optical member (including the beam splitter) for separating a beam from laser source to produce two beams mutually different in frequency (heterodyne beams) and two acousto-optic modulators for producing the frequency differences in the two beams leaving the optical member. Such arrangement is complicated and increases the scale of apparatus, which was inconvenient. Also, a first problem was that the adjustment of optical member was difficult and it was therefore too difficult to keep the precision of position detection within a certain permissible error range in the arrangement in which the two beams different in frequency are produced by provision of two acousto-optic modulators.

Also, in the position detecting apparatus employing the heterodyne interference method as disclosed in above Japanese Laid-open Patent Application No. 2-227604, an optical path difference between the two split beams increases in proportion to wavelength if the two beams (heterodyne beams) different in frequency from each other are produced by splitting a beam from laser source. Therefore, it is theoretically inevitable to use monochromatic light (light of single wavelength), such as laser beam, as the light for position detection. If the alignment is carried out with monochromatic light before replication of circuit pattern on reticle onto a wafer with a resist (photosensitive material) deposited thereon, a second problem of lowering the alignment precision will arise from influence of thin film interference by the resist.

Generally, as a wafer goes through multiple processes, its mark for alignment tends to collapse in cross section, resulting in the cross section being asymmetric. Under such circumstances, the alignment method using interference of monochromatic light such as laser beam had a third problem of lowering the detection precision of position of mark for alignment as the cross section of alignment mark becomes more asymmetric.

SUMMARY OF THE INVENTION

The present invention has been accomplished taking the above problems into consideration. It is a first object of the present invention to provide a double-beam light source apparatus suitable for heterodyne interference method, solving the first problem, and to provide a position detecting apparatus utilizing the heterodyne interference method, which is relatively simple in structure and easy in adjustment of optical members. Further, it is a second object of the present invention to provide a high-precision position detecting apparatus utilizing the heterodyne interference method, solving the second and third problems as described, which can avoid the negative influence of thin film interference of resist and the negative influence of asymmetry of alignment mark.

As described above, it is necessary in the heterodyne interference method that when two beams are converged at a single point a frequency difference between two beams at a time is a predetermined value. For this, a double-beam light source apparatus of the present invention is so arranged that a single beam is emitted from a source and that separation into two beams or provision of frequency difference between the two beams is carried out at a single point in a single element assuring coincidence of optical path length with high accuracy.

Specifically, a double-beam light source apparatus of the present invention comprises (a) a single-beam light source for supplying a single collimated beam and (b) frequency difference producing means for receiving the beam emitted from the light source means, splitting it into two beams while producing a predetermined frequency difference between the two beams with the two beams radially spreading.

The single-beam light source emits a collimated beam toward a beam splitter. The emitted beam may be light of single wavelength or light of multiple wavelengths such as white light.

A frequency difference producer of a first type used in the double-beam light source apparatus of the present invention comprises (i) a beam splitter receiving a beam emitted from the single-beam light source and splitting it into two beams traveling in mutually different directions, (ii) a first relay optical system for receiving and condensing the two beams leaving the beam splitter, and (iii) a modulator disposed at a position where the two beams are converged by the first relay optical system, for changing a frequency in accordance with an incident direction and for changing an outgoing direction.

The beam splitter splits the incident beam into two beams having an identical wavelength and traveling in the different directions with wavefronts thereof being aligned. The beam splitter is preferably a diffraction grating. Employing a diffraction grating, two beams having the same wavelength may be outgoing to travel in different directions with wavefronts being aligned by selecting light of n-th order and −n-th order with wavelength satisfying the diffraction condition.

The two split beams are condensed inside the modulator through the first relay optical system. The modulator may be one of (i) acousto-optic modulators, (ii) radial grating devices, (iii) electro-optic modulators, (iv) photochromic devices, and (v) liquid crystal devices, in which a diffraction grating periodically changing is produced by acoustic means, rotational motion means, or electrical means. The two beams are subjected to Bragg diffraction in the thus produced diffraction grating to produce diffracted light. Properly selecting components or beams from the diffracted light, two beams traveling in different directions and having aligned wavefronts as well as a predetermined frequency difference can be obtained.

If the formation direction of diffraction grating in changer (for example, a traveling direction of acoustic signal (compressional wave) in case of acousto-optic modulator) is arranged to intersect with a plane including vectors or traveling directions of the two incident beams, mixture of zeroth order light into diffracted light can be avoided so as to reduce noise components in the two beams obtained.

A frequency difference producer of a second type used in the double-beam light source apparatus of the present invention is constructed by providing a second modulator behind the first type frequency difference producer. In detail, the second type frequency difference producer comprises (i) a beam splitter for receiving a beam emitted from a single-beam light source to split it into two beams traveling in mutually different directions, (ii) a first relay optical system for receiving and condensing the two beams outgoing from the beam splitter (iii), a first modulator provided at a position where the two beams are converged by the first relay optical system, for modulating a frequency in accordance with an incident direction and for changing an outgoing direction, (iv) a second relay optical system for receiving and condensing the two beams outgoing from the first changer, and (v) a second modulator provided at a position where the two beams are converged by the second relay optical system, for modulating a frequency in accordance with an incident direction and for changing an outgoing direction.

The second type frequency difference producer is so arranged that a beam from the single beam light source is guided through the beam splitter, the first relay optical system and the first modulator to obtain the two beams traveling in mutually different directions and having and a predetermined frequency difference with wavefronts thereof being mutually aligned, similarly as in the first type frequency difference producer. The two beams are converged inside the second modulator through the second relay optical system. The second modulator may be one selected from (i) acousto-optic modulators, (ii) radial grating devices, (iii) electro-optic modulators, (iv) photochromic devices, and (v) liquid crystal devices, as in the first type modulator, in which a periodically changing diffraction grating is produced by acoustic means, rotational motion means, or electrical means. In this arrangement, the formation direction of diffraction grating of first modulator and the formation direction of diffraction grating of second modulator may be made opposite to each other with respect to the traveling direction of the beams with a pitch of each diffraction grating being adjusted. The frequency difference between the two beams finally obtained may be lowered to a degree easy in processing, if the frequency difference obtainable with a single changer is too big. It is preferable in adjustment of frequency difference that the first modulator and the second modulator are of the same type. Properly selecting diffracted light components from beams Bragg-diffracted by the thus produced diffraction grating, one can obtain two beams traveling in different directions and having aligned wavefronts and a frequency difference within a range easy in signal processing.

If the formation directions of diffraction gratings in the first and second modulators are arranged to intersect with a plane including traveling-direction vectors of the two incident beams, the mixture of zeroth order light into diffracted light can be effectively prevented to reduce noise components in the two beams.

A frequency difference producer of a third type used in the double-beam light source apparatus of the present invention comprises a splitter-modulator composed of a single element serving as the beam splitter and the modulator in the first type frequency difference producer, omitting the first relay optical system. The splitter-modulator includes a single acousto-optic modulator, in which a single beam incident thereinto is subjected to the Raman-Nath diffraction by a diffraction grating pattern formed by compressional wave applied to the acousto-optic modulator, thereby to obtain two beams traveling in two predetermined directions and having aligned wavefronts and a predetermined frequency difference.

A frequency difference producer of a fourth type used in the double-beam light source apparatus of the present invention is obtained by arranging a further modulator behind the third type frequency difference producer. In more detail, the fourth type frequency difference producer comprises (i) a splitter-modulator for receiving a beam emitted from the single beam light source to split it into two beams traveling in mutually different directions and for applying a predetermined change of frequency to the two beams, (ii) a relay optical system for-receiving and condensing the two beams outgoing from the beam split-frequency modulator, and (iii) a modulator provided at a position where the two beams are converged by the relay optical system, for modulating a frequency in accordance with an incident direction and for changing an outgoing direction.

The fourth type frequency difference producer is so arranged that the splitter-modulator splits and modulates the single beam from the single beam light source into two beams traveling in different directions and having aligned wavefronts and a predetermined frequency difference, in the same manner as in the third type frequency difference producer. The two beams are converged inside the modulator through the relay optical system. The modulator is an acoustic-optic modulator, in which a periodically changing diffraction grating is produced by application of acoustic signals. By setting the formation direction of diffraction grating of the splitter-modulator and the formation direction of diffraction grating of the modulator opposite to each other with respect to the traveling direction of the beams and by adjusting the pitch of the diffraction gratings, one can lower a frequency difference between the two beams finally obtained to a degree easy in processing, if the frequency difference obtained by the splitter-modulator is too big. The beams are subjected to the Raman-Nath diffraction by the thus produced diffraction grating in the splitter-modulator and to the Bragg diffraction by the diffraction grating in the modulator. Properly selecting diffracted light components, one can obtain two beams traveling in different directions and having aligned wavefronts and a frequency difference within a range easy in signal processing.

If the formation direction of diffraction grating in modulator is arranged to intersect with a plane including traveling-direction vectors of two incident beams, the mixture of zeroth order light into the diffracted light may be effectively prevented to reduce noise components in the two beams.

A position detecting apparatus of the present invention uses one of the double-beam light source apparatus of the present invention as described, which detects a relative position between objects to be measured by the heterodyne interference method. In more detail, the position detecting apparatus of the present invention comprises (i) the double-beam light source apparatus of the present invention, (ii) a beam separator for separating two beams outgoing from the double-beam light source apparatus into two sets of double beams, (iii) a first condenser for condensing a set of double beams outgoing from the beam separator, (iv) a reference diffraction grating provided at the condensing position of the first condenser, (v) a first photodetector for detecting an optical image of diffracted light from the reference diffraction grating, (vi) a second condenser for condensing the other set of double beams outgoing from the beam separator, (vii) a second photodetector for detecting an optical image of diffracted light from a diffraction grating on an object to be measured, disposed at a condensing position of the second condenser, and (viii) an optical image processor for receiving an output signal of the first photodetector and an output signal of the second photodetector to compare the both optical images with each other and for calculating a displacement amount of the measured object from the reference position.

Further, in addition to the arrangement of the above position detecting apparatus, an apparatus may comprise a third condenser for again condensing the two beams diffusing after condensed by the second condenser, and a third photodetector for detecting an optical image of diffracted light by a diffraction grating on a second object to be measured, disposed at a condensing position of the third condenser, in which the optical image processor receives an output signal of the third photodetector in addition to the output signals of the first and second photodetectors and a relative positional deviation is obtained between the position of the first measured object and the position of the second measured object, whereby the deviation maybe accurately measured between the two objects to be measured. The apparatus may further comprise a driver for the first measured object and a driver for second measured object, in which a deviation between the measured objects is adjusted for alignment, whereby a precise aligning apparatus may be attained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given byway of illustration only, since various changes and modifications within the spirit and scope of the invention will become apparent to those skilled in the art form this detailed description.

DESCRIPTION OF THE PREFERRED EMBODIMENTS

Figure 1:
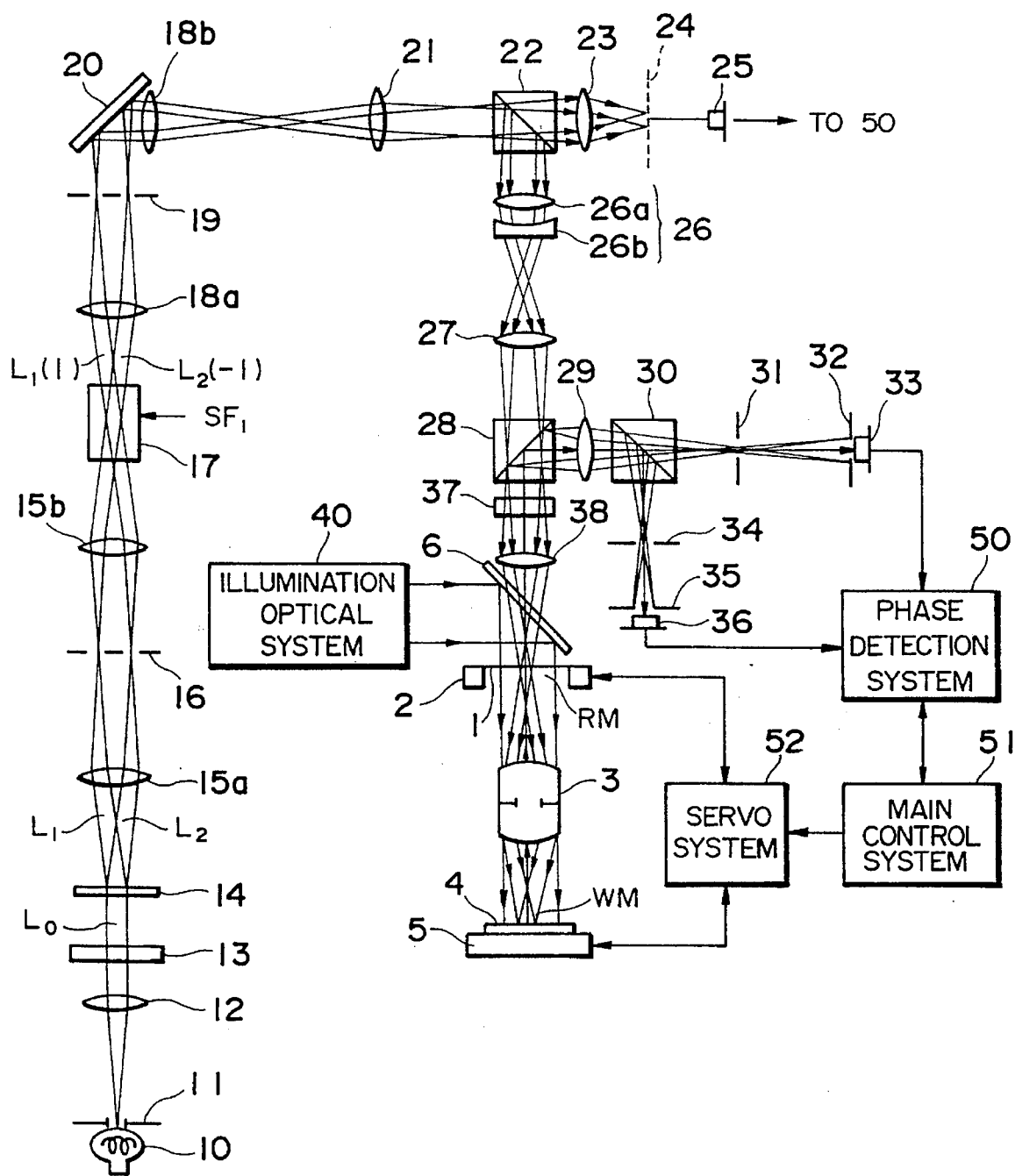
FIG. 1 is a drawing to show the schematic structure of the first embodiment according to the present invention.

The preferred embodiments of the present invention will be described in detail with reference to the accompanying drawings. Projection exposure apparatus will be described in the preferred embodiments, in which the double-beam light source apparatus and the position detecting apparatus according to the present invention are employed.
First Embodiment FIG. 1 is a schematic constitutional drawing of the first embodiment to show a projection exposure apparatus in which the double-beam light source and the position detecting apparatus of the present invention are used. The double-beam light source in the first embodiment employs the first type frequency difference producer as described before. The first embodiment will be described in detail with reference to FIG. 1.

A reticle (mask) 1 has a predetermined circuit pattern and a diffraction grating mark RM for alignment disposed at the peripheral portion of pattern and is held on a reticle stage 2, which is two-dimensionally movable. The reticle 1 is positioned conjugate with a wafer (substrate) 4 with respect to a projection objective lens 3.

Exposure light from an illumination optical system 40 is reflected downward by a dichroic mirror 6 inclined at 45° above the reticle to uniformly illuminate the reticle 1. The pattern on the illuminated reticle is replicated onto the wafer 4 through the projection objective lens 3. Formed on the wafer 4 is a diffraction grating mark WM for alignment, which is similar to the diffraction grating mark RM formed on the reticle.

The wafer 4 is held on a wafer stage 5, which two-dimensionally moves in step-and-repeat process. The wafer is stepped to a next shot position after completion of replication of reticle pattern at a shot area.

There are unrepresented interferometers, one for each of the reticle stage 2 and the wafer stage 5, to independently detect positions of the stages in the x direction, in the y direction and in the rotational (θ) direction. Each stage is driven by an unrepresented drive motor in the directions.

An alignment optical system for position detection is disposed above the dichroic mirror 6. The alignment optical system is described in detail in the following.

A white light source 10 such as a Xe lamp and a halogen lamp emits white light in wavelength band different from that of the exposure light. The white light is guided through a variable aperture diaphragm 11 and a condenser lens 12 to be converted into a collimated beam $L_0$. The collimated beam $L_0$ is guided through a band-pass filter 13 extracting light in predetermined wavelength range to vertically illuminate a diffraction grating 14. The collimated beam $L_0$ vertically illuminating the diffraction grating 14 is split into ±1st order diffracted light components or beams ($L_1$, $L_2$) having the predetermined wavelength range by the diffraction effect of the diffraction grating 14.

The ±1st order diffracted light components ($L_1$, $L_2$) having the predetermined wavelength range are converged by a relay optical system having lenses 15a and 15b. Then, the condensed beams enter an acousto-optic modulator (as will be referred to as AOM) 17 at the same incident angle in symmetry with each other. A space filter 16 is disposed between the lenses 15a and 15b to extract the ±1st order diffracted light components leaving the diffraction grating 14.

The AOM 17 is driven with a high frequency signal $SF_1$ of frequency $f_1$. The beams $L_1$ and $L_2$ in predetermined wavelength range are subjected to the acoustic Bragg diffraction in AOM 17.

Suppose the beams $L_1$ and $L_2$ in predetermined wavelength range respectively have a frequency $f_0$. Then, +1st order diffracted light $L_1$ (1) (as will be referred to as beam $L_1$ (1)) of the beam $L_1$ in predetermined wavelength range is frequency-modulated by the AOM 17 to have a frequency of $f_0+f_1$, while −1st order diffracted light $L_2$ (−1) (as will be referred to as beam $L_2$ (−1)) of the beam $L_2$ in predetermined wavelength range is frequency-modulated by the AOM 17 to have a frequency of $f_1-f_1$.

After that, the beam $L_1$ (1) and the beam $L_2$ (−1) pass through a lens 18a, a reflection mirror 20, a lens 18b and a lens 21 and then is split into two by a beam splitter 22. A space filter 19 is provided between the lens 18 and the lens 18b constituting a relay optical system to extract the +1st order diffracted light beam $L_1$ (1) and the −1st order diffracted light beam $L_2$ (−1).

The beam $L_1$ (1) and the beam $L_2$ (−1) passing through the beam splitter 22 are converged by a lens 23 and form interference fringes flowing along the pitch direction on a diffraction grating 24 for reference disposed at the condensing position of the lens 23. Diffracted light through the diffraction grating 24 is photoelectrically detected as optical beat signal for reference by a detector 25.

On the other hand, the beam $L_1$ (1) and the beam $L_2$ (−1) reflected by the beam splitter 22 pass through a relay optical system (26a, 26b, 27), a beam splitter 28 and a parallel-plane plate 37.

The parallel-plane plate 37 is located at or near the pupil-conjugate position of the projection objective lens 3 such that its inclination angle is variable to the optical axis of alignment optical system, having a function to maintain the system telecentric. The parallel-plane plate 37 may be replaced by a combination of a thick parallel-plane plate for coarse adjustment with a thin parallel-plane plate for fine adjustment.

The beam $L_1$ (1) and the beam $L_2$ (−1) passing through the parallel-plane plate 37 then passes through an objective lens 38 and the dichroic mirror 6 to illuminate the diffraction grating mark RM on the reticle 1 in two directions having a predetermined cross angle.

In case that the projection lens 3 is not achromatic to the alignment light, the objective lens 38 is preferably a bifocal optical system as proposed in Japanese Laid-open Patent Application No. 63-283129. In this arrangement, two beams entering the bifocal optical system are split respectively into polarized light components perpendicular to each other. One of the two polarized light components from each beam directed toward the first focus is converged on the reticle, while the other of the two polarized light components from each beam directed toward the second focus is converged on the wafer.

Figure 2:
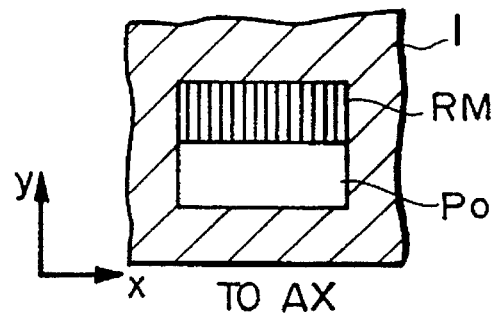
FIG. 2 and FIG. 3 are plan views to show appearance of diffraction grating marks.
Figure 3:
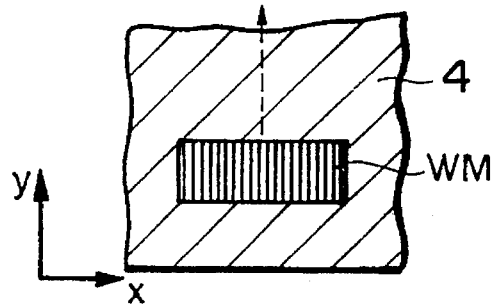

As the beam $L_1$ (1) and the beam $L_2$ (−1) illuminate the diffraction grating mark RM on the reticle, the reticle 1 has an alignment light transmitting window $P_0$ next to the diffraction grating mark RM, as shown in FIG. 2, and the diffraction grating mark WM is formed at the position corresponding to the transmitting window $P_0$ on the wafer, as shown in FIG. 3.

The beams $L_1$ (1) and $L_2$ (−1) illuminate the diffraction grating mark RM and the transmitting window $P_0$ as covering them, so that interference fringes flowing along the pitch direction are formed on the diffraction grating mark RM. +1st order diffracted light of the beam $L_1$ (1) and −1st order diffracted light of the beam $L_1$ (−1) advance in the direction normal to the diffraction grating mark RM (along the optical axis of projection objective lens 3).

The beams $L_1$ (1) and $L_2$ (−1) are arranged to illuminate the diffraction grating mark RM in the two directions with a cross angle satisfying the following relation.

$$\sin \theta_{RM} = \lambda_0 / P_{RM} \tag{1}$$

where $P_{RM}$ is a pitch of diffraction grating mark RM, $\lambda_0$ a base wavelength of light emitted from the light source 10, and $\theta_{RM}$ an incident angle of beam $L_1$ (1) or beam $L_2$ (−1) into the diffraction grating mark RM.

By this, ±1st order diffracted light beams from the diffraction grating mark RM are guided to pass again through the dichroic mirror 6, the objective lens 38 and the parallel-plane plate 37. After that, the ±1st order diffracted light beams are reflected by the beam splitter 28 to pass through a lens 29 and a beam splitter 30 then to reach a field aperture 34.

Figure 4:
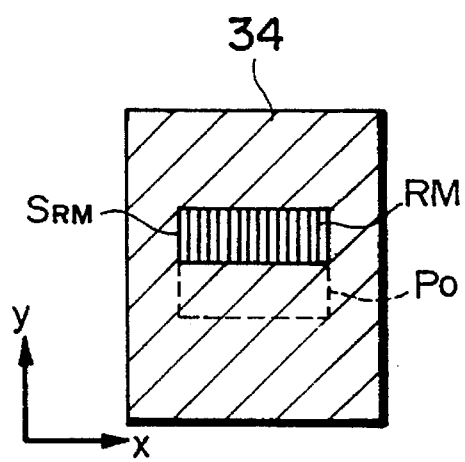
FIG. 4 and FIG. 5 are plan views to show appearance of field apertures provided in alignment optical system.

The field aperture 34 is located conjugate with the reticle 1. Specifically, the field aperture 34 has an opening portion $S_{RM}$ at the position corresponding to the diffraction grating mark RM to permit only diffracted light from the diffraction grating mark RM on the reticle 1 to pass therethrough, as shown in FIG. 4.

Then, the diffracted light from the diffraction grating mark RM passing through the field aperture 34 is filtered by a space filter 35 for cutting zeroth order diffracted light, so that only ±1st order diffracted light reaches a detector 36. The photoelectric detector 36 photoelectrically detects an optical beat signal including information on position of reticle 1.

A part of beams $L_1$ (1) and $L_2$ (−1) passing through the transmitting window $P_0$ of reticle 1 illuminate through the projection objective lens 3 the diffraction grating mark WM on the wafer 4 in two directions with a certain cross angle, so that interference fringes flowing along the pitch direction are formed on the diffraction grating mark WM. −1st order diffracted light of the beam $L_1$ (1) and +1st order diffracted light of the beam $L_2$ (−1) are made to advance in the direction normal to the diffraction grating mark WM (along the optical axis of projection objective lens 3).

The beams $L_1$ (1) and $L_2$ (−1) are arranged to illuminate the diffraction grating mark RM in two directions with a cross angle satisfying the following relation.

$$\sin \theta_{WM} = \lambda_0 / P_{WM}, \tag{2}$$

where $P_{WM}$ is a pitch of diffraction grating mark WM, $\lambda_0$ a reference wavelength of light emitted from light source 10, and $\theta_{WM}$ an incident angle of beam $L_1$ (1) or beam $L_1$ (−1) into the diffraction grating mark WM.

Then, ±1st order diffracted light from diffraction grating mark WM then pass again through the projection objective lens 3, the transmitting window $P_0$, the dichroic mirror 6, the objective lens 38 and the parallel-plane plate 37, and is reflected by the beam splitter 28 to pass through the lens 29 and the beam splitter 30 then to reach a field aperture 31.

Figure 5:
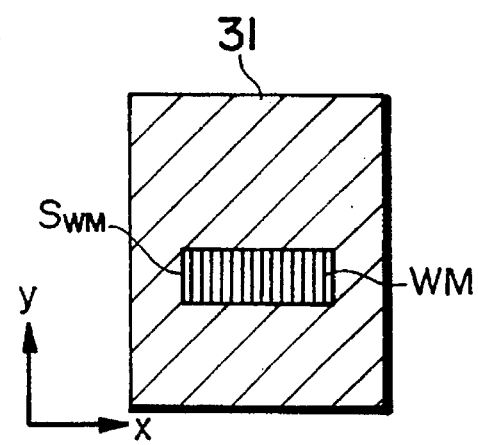

The field aperture 31 is located conjugate with the wafer 4. Specifically, the field aperture 31 has an opening portion $S_{WM}$ at the position corresponding to the diffraction grating mark WM to permit only diffracted light from the diffraction grating mark WM on the wafer 4 to pass therethrough, as shown in FIG. 5.

The diffracted light from the diffraction grating mark WM passing through the field aperture 31 is filtered by a space filter 32 for cutting zeroth order diffracted light, so that only ±1st order diffracted light beams reach a detector 33. The photoelectric detector 33 photoelectrically detects an optical beat signal including information on position of wafer 4.

Each space filter (32, 35) is located at a position approximately conjugate with the pupil of alignment optical system, that is, substantially conjugate with the pupil (exit pupil) of projection objective lens 3 so that the zeroth order diffracted light (regular reflection light) from diffraction grating mark (RM, WM) formed on reticle 1 or wafer 4 is interrupted and that only ±1st order diffracted light (diffracted light advancing normal to the diffraction grating mark on reticle 1 or wafer 4) can pass therethrough. Also, each detector (33, 36) is disposed approximately conjugate with reticle 1 or wafer 4 with respect to the objective lens 38 and the lens 29.

In the arrangement of alignment optical system as described above, each of three signals obtained by the detectors (25, 33, 36) includes a sinusoidal optical beat signal of same frequency $\Delta f$ ($= |2f_1|$). An optical beat signal extracting portion (Fourier transform circuit) in phase difference detection system 50 effects the Fourier transform electrically on the three photoelectric signals, whereby three sinusoidal optical beat signals of frequency Δf are extracted at excellent precision.

Suppose the reticle 1 and the wafer 4 are stopped at arbitrary respective positions before aligned. Then, the optical beat signals will have a certain phase difference. A phase difference of ±180° between the optical beat signals from reticle 1 and from wafer 4 is uniquely correspondent to a displace amount of relative position within a half of the grating pitch of diffraction grating marks respectively formed on the reticle 1 and on the wafer 4.

Thus, as the reticle 1 is moved relative to the wafer 4 in the direction of grating arrangement, pre-alignment is carried out at precision of relative position deviation amount below a half of the grating pitch of diffraction grating marks (RM, WM) and then a main control system 51 performs alignment by two-dimensionally moving the reticle stage 2 or the wafer stage 5 through a servo system 52 as to make a phase difference obtained by the phase difference detection system 50 equal to zero or a certain value, whereby high-resolution position detection may be achieved.

Alternatively, using the optical beat signal for reference obtained by the detector 25 as a reference signal, the alignment may be conducted as to make a phase difference equal to zero or a certain value between the reference signal and the optical beat signals from diffraction grating marks (RM, WM). Also, a drive signal for driving the AOM 17 may be used as a reference signal.

Figure 6:
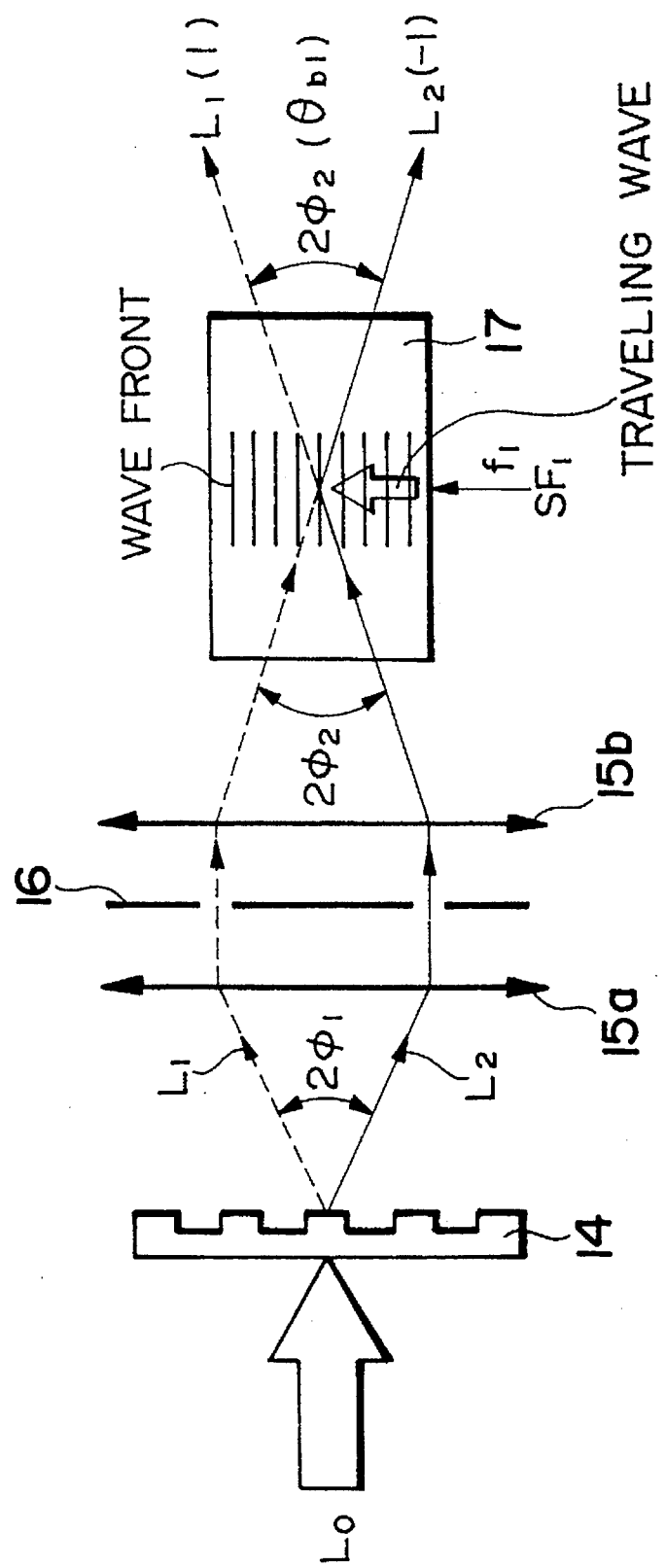
FIG. 6 is a drawing to show the structure of a double-beam producing portion (which is a portion producing two beams different in frequency from each other) in the first embodiment.

Next described with FIG. 6 are a specific construction and the theory in production of two beams different in frequency from each other in the first embodiment shown in FIG. 1.

When white light $L_0$ illuminates the diffraction grating 14 in the direction normal thereto, as shown in FIG. 6, diffracted light appears by diffraction through the diffraction grating 14, including components of various orders for each wavelength.

The diffracted light includes components of various orders satisfying the following condition (3):

$$\sin \Phi_1 = N\lambda/P_G \quad (3)$$

where $\Phi_1$ is a diffraction angle of diffracted light with respect to the direction of normal line to the diffraction grating 14, $P_G$ a pitch of diffraction grating 14, $\lambda$ a wavelength of light, and N (integers) the order of diffracted light component.

Then, the diffracted light including the various order components in a certain wavelength band passes through the condensing lens 15a and is filtered by the space filter 16 disposed at the rear focus position of condenser lens 15a (or at the front focus position of condenser lens 15b) so that components other than ±1st order diffracted light components in predetermined wavelength band are shielded and that only the ±1st order diffracted light components ($L_1$, $L_2$) in predetermined wavelength band pass through the filter 16 then to go through the condenser lens 15b toward the AOM 17.

Let us now consider the diffraction angle of ±1st order diffracted light components ($L_1$, $L_2$) passing through the space filter 16. For example, suppose the base wavelength $\lambda_0$ of irradiation light $L_0$ is 633 nm, the wavelength band of irradiation light $L_0$ is $\lambda_0 \pm \Delta\lambda (=20$ nm), and the pitch of diffraction grating 14 is 4 μm. Then, the diffraction angle of ±1st order diffracted light components is 8.82° for minimum wavelength of 613 nm, while 9.40° for maximum wavelength of 653 nm by above Equation (3).

Accordingly, light having the wavelength band of 613 nm-653 nm supplies ±1st order diffracted light components with diffraction angle in a range of 8.82°–9.40°.

As described, the diffraction angle $\Phi_1$ varies depending upon the wavelength in light. In the present embodiment, as shown in FIG. 6, the relay optical system 16 relays the diffraction point of diffraction grating 14 into the traveling path of ultrasonic wave in AOM 17 so that ±1st order diffraction light components of each wavelength are converged inside the AOM 17. Therefore, the ±1st order diffracted light components ($L_1$, $L_2$) in predetermined wavelength band, which are symmetrically split into two by the diffraction grating 14, enter the AOM 17 symmetrically at an incident angle $\Phi_2$ preset for each wavelength.

This will be described in more detail using equations. First, the ±1st order diffracted light components ($L_1$, $L_2$) in predetermined wavelength range enter the AOM 17 at the incident angle $\Phi_2$ in two directions and are subject to the acoustic Bragg diffraction in AOM 17.

The AOM 17 is driven by a high-frequency signal $SF_1$ of such a frequency $f_1$ that the +1st order diffracted light $L_1$ in predetermined wavelength range produces +1st order diffracted light $L_1$ (1) with diffraction angle of $2\Phi_2$ (double of incident angle $\Phi_2$) and that the −1st order diffracted light $L_2$ in predetermined wavelength range produces −1st order diffracted light $L_2$ (−1) with diffraction angle of $2\Phi_2$.

Letting the diffraction angle by Bragg diffraction of AOM 17 be $\theta_{b1}$ $(=2\Phi_2)$, a velocity of ultrasonic wave (traveling wave) crossing the AOM 17 be $v_1$, the frequency of ultrasonic wave of high-frequency signal $SF_1$ be $f_1$, the wavelength of light be $\lambda$, and the wavelength of ultrasonic wave (traveling wave) crossing the AOM 17 be $\Lambda_1$, the following relations of Equations (4) and (5) stand.

$$\Lambda_1 = v_1/f_1 \quad (4)$$

$$\sin \theta_{b1} = \lambda/\Lambda_1 \quad (5)$$

From above Equations (4) and (5), the diffraction angle $\theta_{b1}$ $(=2\Phi_2)$ by AOM 17 is finally obtained by following Equation (6).

$$\sin \theta_{b1} = f_1 \lambda/v_1 \text{ (or } \sin 2\Phi_2 = f_1 \lambda/v_1) \quad (6)$$

Therefore, the +1st order diffracted light $L_1$ (1) in predetermined wavelength range and the −1st order diffracted light $L_2$ (−1) in predetermined wavelength range symmetrically leave the AOM 17 at a diffraction angle for each wavelength satisfying above Equation (6).

Supposing the magnification of relay optical system (15a, 15b) is $\beta_1$ and the relay optical system (15a, 15b) satisfies the sine condition, the following relation stands.

$$\beta_1 = \sin \Phi_1/\sin \Phi_2 \approx 2 \sin \Phi_1/\sin (2\Phi_2) \quad (7)$$

The following Equation (8) can be derived from Equations (3), (6) and (7).

$$\beta_1 = (2v_1)/(P_G f_1) \quad (8)$$

The relay optical system (15a, 15b) is preferably arranged to satisfy above Equation (8) accordingly.

Figure 7:
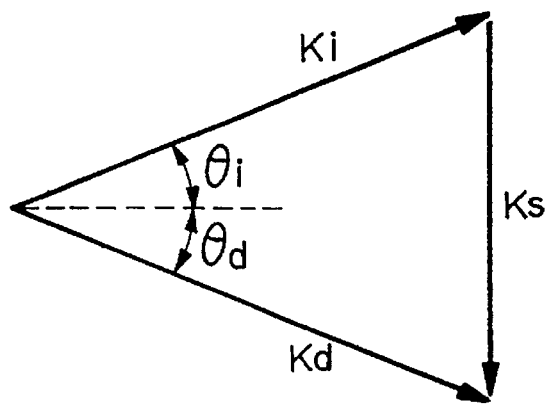
FIG. 7 is a drawing to illustrate the theory of acoustic Bragg diffraction by acousto-optic modulator.

Next described with FIG. 7 is the light frequency modulation by the acoustic Bragg diffraction. In FIG. 7, $\theta_i$ represents an angle between the wavefront of ultrasonic wave of drive signal $SF_1$ in AOM 17 and the incident light (incident angle of incident light), $\theta_d$ an angle between the wavefront of ultrasonic wave of drive signal $SF_1$ in AOM 17 and diffracted light, $K_i$ a wave vector of incident light into AOM 17, $K_d$ a wave vector of diffracted light by AOM 17, and $K_s$ a wave vector of ultrasonic wave of high-frequency signal $SF_1$.

If incident light and diffracted light satisfy the condition of acoustic Bragg diffraction, the vectors are in relation of isosceles triangle. With wavelength $\lambda$ of light, index of refraction n of AOM 17, frequency $f_1$ of ultrasonic wave, and velocity $v_1$ of ultrasonic wave (traveling wave) crossing the AOM 17, the amplitudes of $K_i$, $K_d$ and $K_s$ may be expressed as follows.

$$|K_i|=2\pi n/\lambda \tag{9}$$

$$|K_d|=2\pi n/\lambda \tag{10}$$

$$|K_s|=2\pi f_1/v_1 \tag{11}$$

Further, $\theta_i$ and $\theta_d$ are equal to each other, and thus are rewritten as $\theta_0$. Letting the wavelength of ultrasonic wave be $\Lambda_1$, the following relations stand.

$$\sin 2\theta_0 = \lambda/\Lambda_1 \tag{12}$$

$$|K_s|=2(\sin\theta_0)\cdot|K_d| \tag{13}$$

Assuming $\sin 2\theta_0 \approx 2(\sin\theta_0)$, following Equation (14) may be derived from Equations (12) and (13).

$$|K_s|=2\pi n/\Lambda_1 \tag{14}$$

As apparent from this Equation (14), the amplitude $|K_s|$ is constant irrespective of wavelength of light as far as the Bragg diffraction condition is satisfied. It is, therefore, understood that light diffracted by AOM 17 is subject to the same frequency modulation ($f_1$) regardless of wavelength of light.

If the beams ($L_1$, $L_2$) incident into AOM 17 in two directions have a frequency f, +1st order diffracted light $L_1$ (1) of the beam $L_1$ is equally frequency-modulated to have a frequency of $f+f_1$ ($=F_1$); −1st order diffracted light $L_2$ (−1) of the beam $L_2$ is equally frequency-modulated to have a frequency of $f-f_1$ ($=F_2$).

Since the +1st order diffracted light $L_1$ (1) of frequency $F_1$ in predetermined wavelength range and the −1st order diffracted light $L_2$ (−1) of frequency $F_2$ in predetermined wavelength range can symmetrically illuminate the diffraction gratings (24, RM, WM) with a component of each wavelength impinging at an incident angle different from others, ±1st order diffracted light components of each wavelength can always appear in the direction normal to the respective diffraction gratings (24, RM, WM). This results in production of beat light including a predetermined frequency ($\Delta f=|F_1-F_2|=|2f_1|$) from the ±1st order diffracted light components of each wavelength. Thus, the beat light of multiple wavelengths including the predetermined frequency ($\Delta f=|F_1-F_2|=|2f_1|$) can be photoelectrically detected by the respective detectors (25, 33, 36) (some wavelength components are detected from the beat light including positional information of each diffraction grating). Therefore, high-precision alignment can be achieved in heterodyne interference method while suppressing the influence of asymmetry of each diffraction grating mark by averaging effect of beat light signals of some wavelengths as well as the influence of thin film interference of resist (influence such as a change in light quantity) with multiple wavelength light.

In addition, the white light (multi-wavelength light) is symmetrically split with respect to the incident direction (direction of optical axis) by the diffraction grating 14 (beam splitting means) and the thus split light travels symmetrically and concurrently through the relay optical system and the AOM 17, whereby no difference of optical path length is theoretically present between the two split beams. Therefore, the wavefronts of the split beams are aligned with zero phase difference, so that high-precision alignment becomes possible, achieving a compact apparatus easy in adjustment.

In the first embodiment, the ±1st order diffracted light components ($L_1$ (1), $L_2$ (−1)) optically modulated in and symmetrically leaving the AOM 17 are used as beams for alignment, the ±1st order diffracted light components ($L_1$ (1), $L_2$ (−1)) are guided to illuminate the diffraction gratings (24, RM, WM) in two directions, the diffraction gratings produce signals of beat light of predetermined frequency ($\Delta f=|2f_1|$) upon the irradiation, and the signals of beat light are extracted through the detectors (25, 33, 36) and the optical beat signal extracting portion (Fourier transform circuits) in the phase difference detection system 50 to utilize extracted signals for alignment. Its reason is as follows.

Figure 8:
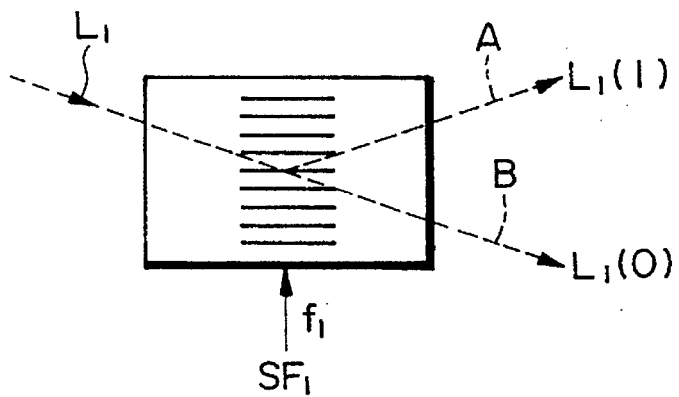
FIG. 8 and FIG. 9 are drawings to show a situation to produce noise light in acousto-optic modulator in the first embodiment.
Figure 9:
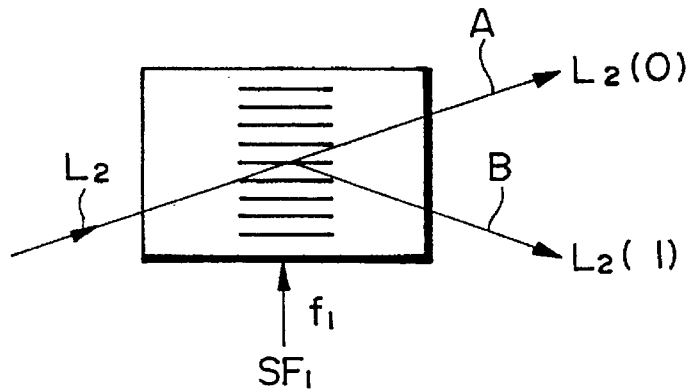

In the present embodiment, as shown in FIG. 8 and FIG. 9, zeroth order diffracted light $L_2$ (0) of the beam $L_2$ is mixed in an optical path A of first order diffracted light $L_1$ (1), and zeroth order diffracted light $L_1$ (0) of the beam $L_1$ in optical path B of −1st order diffracted light $L_2$ (−1) upon optical modulation in AOM 17. Upon optical modulation, the zeroth order diffracted light $L_1$ (0) of the beam $L_1$ and the zeroth order diffracted light $L_2$ (0) of the beam $L_2$ are free of frequency modulation for each wavelength, maintaining the original frequency $f_0$.

Thus, there are mixed in optical path A the first order diffracted light $L_1$ (1) of frequency of $f_0+f_1$ and the zeroth order diffracted light $L_2$ (0) of frequency of $f_0$. Also in optical path B, there are mixed the −1st order diffracted light $L_2$ (−1) of frequency of $f_0-f_1$ and the zeroth order diffracted light $L_1$ (0) of frequency of $f_0$. If they are guided to illuminate the diffraction gratings (24, RM, WM) in two directions, beat light is produced with various beat frequencies in the direction normal to the respective diffraction gratings (24, RM, WM). Then, if the alignment is carried out based on signals obtained by simply photoelectrically converting the beat light having various beat frequencies by means of the detectors (25, 33, 36), signals of various beat frequencies would be noise signals, negatively affecting the detection precision and making the alignment impossible.

First, study is made in the following on the beat light having various beat frequencies produced by optical modulation of AOM 17.

There are frequencies of diffracted light components listed below.

In optical path A:
frequency of +1st order diffracted light $L_1$ (1): $f_0+f_1$ (I)
frequency of zeroth order diffracted light $L_2$ (0): $f_0$ (II).

In optical path B:
frequency of −1st order diffracted light $L_2$ (−1): $f_0-f_1$ (I')
frequency of zeroth order diffracted light $L_1$ (0): $f_0$ (II').

Thus, the beat light may have the following frequencies from the combination of diffracted light traveling in optical path A with diffracted light traveling in optical path B.

Taking an absolute value of difference between (I) and (I'), $$|(f_0+f_1)-(f_0-f_1)|=|2f_1| \tag{1}$$

Taking an absolute value of difference between (I) and (II'), $$|(f_0+f_1)-f_0|=|f_1| \tag{2}$$

Taking an absolute value of difference between (II) and (I'), $|f_0-(f_0-f_1)|=|f_1|$  [3].

Taking an absolute value of difference between (II) and (II'), $|f_0-f_0|=0$  [4].

Therefore, the beat light photoelectrically detected by the detectors (25, 33, 36) includes three beat frequencies of [1]–[3]. If the component of [4] is included in the diffracted light and photoelectrically detected by the detectors (25, 33, 36), it will be a direct current component (DC component). In case that the DC component negatively affects the detection precision, it may be removed when the Fourier transform is effected in the optical beat signal extracting portion in phase difference detection system 50. Alternatively, the DC component may be removed by electrical filter means separately provided.

A beat frequency which can be utilized for alignment is one which does not appear twice in the listed beat frequencies. Therefore, in the present embodiment a signal of beat frequency of $|2f_1|$, which is only one beat light produced and appearing once in the combination of beam $L_1$ (1) with beam $L_2$ (–1), is extracted by the optical beat signal extracting portion (Fourier transform circuit) in phase difference detection system 50.

Even if the detectors (25, 33, 36) photoelectrically detect beat light having various beat frequencies, high-precision alignment can be achieved by heterodyne interference, based on the signal of predetermined beat frequency ($|2f_1|$) extracted by the optical beat signal extracting portion (Fourier transform circuit) in the above arrangement.

By properly arranging the diffraction grating 14 and the AOM 17, unnecessary diffracted light $L_2$ (0) traveling in optical path A of beam $L_1$ (1) and unnecessary diffracted light $L_1$ (0) traveling in optical path B of beam $L_1$. (–1) can be separated out and filtered by the space filter 19, as described hereinafter.

Although the first embodiment shown in FIG. 1, FIG. 6 and FIGS. 8 and 9 shows an example in which the ±1st order diffracted light beams split by the diffraction effect of diffraction grating 14 are guided to enter the AOM 17 as two beams for position detection and in which +1st order light from one of the two beams diffracted through AOM 17 and –1st order light from the other of the two beams diffracted through AOM 17 are guided to irradiate marks for position detection in two directions as two beams for position detection, the invention is not limited to this example. For example, any two diffracted light components of arbitrary order produced by the diffraction grating 14 can be used as two beams for position detection as guided to enter the AOM 17. Further, another arrangement is such that a diffracted light component of arbitrary order from one of two beams diffracted through AOM 17 and a diffracted light component of arbitrary order from the other of two beams diffracted through AOM 17 are guided to illuminate marks for position detection in two directions.

Although the first embodiment shown in FIG. 1 shows an example in which the light source means (10–12) supplies a beam including light of plural wavelengths (multiple wavelengths), the invention is not limited to this example. The light source means may be a laser source supplying light of single wavelength, whereby the alignment can be achieved in heterodyne interference method. In this case, the advantage in the heterodyne interference method using light of multiple wavelengths cannot be enjoyed in alignment, but two beams different in frequency from each other can be produced without difference of optical path length by simply arranging in series a diffraction grating and an acousto-optic modulator on either side of a relay optical system. Thus, the apparatus so arranged is simple in structure and remarkably easy in adjustment as compared with the conventional apparatus.

Second Embodiment

Figure 10:
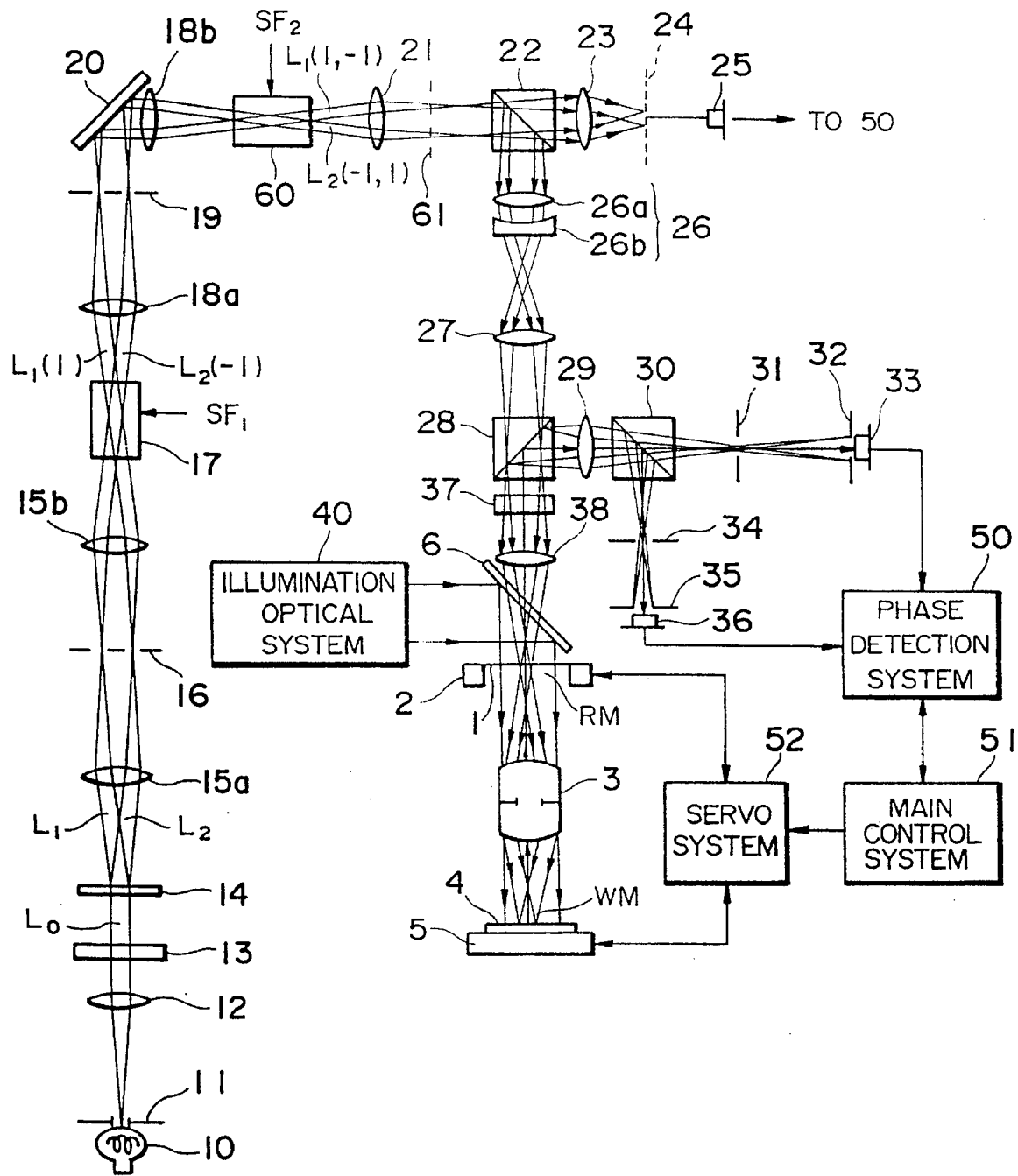
FIG. 10 is a drawing to show the schematic structure of the second embodiment according to the present invention.

The second embodiment according to the present invention will be described with reference to FIG. 10. The present embodiment employs the second type frequency difference producer as described before. In FIG. 10 members having the same functions as those in the first embodiment shown in FIG. 1 are given the same reference numerals.

The present embodiment is different from the first embodiment in that a second acousto-optic modulator 60 (as will be referred to as AOM 60) is provided between the relay optical system (18a, 18b) and the condenser lens 21, that a space filter 61 is provided between the condenser lens 21 and the beam splitter 22, and that the lens 18a and the lens 18b serve as a second relay optical system for relaying the diffraction point of AOM 17 (first acousto-optic modulator) to the diffraction point of AOM 60 (second acousto-optic modulator).

In the present embodiment a high-frequency signal $SF_2$ applied to AOM 60 travels in the direction opposite to the traveling direction of the high-frequency signal $SF_1$ applied to AOM 17, whereby a finally obtained beat frequency may be lowered (below 1 MHz) to facilitate the processing of electric signal.

As shown in FIG. 10, white light from white light source 10, which supplies light in a certain wavelength band (multiple wavelengths) different from that of exposure light, is guided to pass through a variable aperture 11, a condenser lens 12 and a band-pass filter 13 then to illuminate a diffraction grating 14 in the direction normal thereto and then is split by diffraction effect of the diffraction grating 14 into ±1st order diffracted light ($L_1$, $L_2$) having a predetermined wavelength range. After the ±1st order diffracted light ($L_1$, $L_2$) having the predetermined wavelength range is condensed by a relay optical system (15a, 15b), it enters the AOM 17 symmetrically at equal incident angle. A space filter 16 disposed between the lenses 15a and 15b extracts the ±1st order diffracted light leaving the diffraction grating 14.

The AOM 17 is driven by a first high-frequency signal $SF_1$ of frequency $f_1$. Assuming the beams $L_1$ and $L_2$ in predetermined wavelength range respectively have a frequency f, the beam $L_1$ in predetermined wavelength range is frequency-modulated by AOM 17 to produce +1st order diffracted light $L_1$ (1) (as will be referred to as beam $L_1$ (1)) of frequency ($f_0+f_1$), while the beam $L_2$ in predetermined wavelength range is frequency-modulated by AOM 17 to produce –1st order diffracted light $L_2$ (–1) (as will be referred to as beam $L_2$ (–1)) of frequency ($f_0-f_1$). After that, the beams $L_1$ (1) and $L_2$ (–1) pass through a lens 18a, a reflection mirror 20 and a lens 18b to symmetrically enter the AOM 60 at equal incident angle. A space filter 19 disposed in the second relay optical system (15a, 15b) extracts only ±1st order diffracted light ($L_1$ (1), $L_2$ (–1)) leaving the AOM 17.

The AOM 60 is driven by a second high-frequency signal of frequency $f_2$ traveling in the direction opposite to that of AOM 17. The beam $L_1$ (1) in predetermined wavelength range is frequency-modulated by AOM 60 to produce –1st order diffracted light $L_1$ (1, –1) (as will be referred to as beam $L_1$ (1, –1)) of frequency of $f_0+f_1-f_2$ (=$F_1$), while the beam $L_2$ (–1) in predetermined wavelength range is frequency-modulated by AOM 60 to produce +1st order diffracted light L₂ (−1, 1) (as will be referred to as beam L₂ (−1, 1)) of frequency of $f_0-f_1+f_2$ (=F₂). Then, the beams L₁ (1, −1) and L₂ (−1, 1) pass through a lens 21 and are respectively split into two by a beam splitter 22. The space filter 61 is provided in the second relay optical system (18a, 18b) so that it extracts the −1st order diffracted light L, (1, −1) and ±1st order diffracted light L₂ (−1, 1) leaving the AOM 60.

The beams thus split into two by the beam splitter 22 are photoelectrically detected by the detectors (25, 33, 36) at final step in the same manner as in the first embodiment shown in FIG. 1 as described before. Therefore, the details of the detection are omitted herein. In the present embodiment, an optical beat signal extracting portion (Fourier transform circuit) in phase difference detection system 50 extracts beat signals of predetermined frequency ($\Delta f=|F_1-F_2|=|2(f_1-f_2)|$) formed by the light components of respective wavelengths, out of photoelectric signals photoelectrically detected by the detectors (25, 33, 36), and the alignment is carried out based on these extracted signals.

As described above, the present embodiment is so arranged that two AOMs are arranged in series and are driven by high-frequency signals (SF₁, SF₂) traveling in opposite directions, whereby the frequencies of beat signals photoelectrically detected by the, detectors (25, 33, 36) can be lowered below 12 MHz, which is easy in signal processing.

For example, if the AOM 17 is driven by a first high-frequency signal SF₁ of frequency f₁ of 100 MHz and if the AOM 60 is driven by a second high-frequency signal SF₂ of frequency f₂ of 99.9 MHz in the opposite direction to that in AOM 17, after passing through AOM 60, the one beam L₁ (1, −1) has a frequency of $F_1=f_0+f_1-f_2$ and the other beam L₂ (−1, 1) a frequency of $F_2=f_0-f_1+f_2$, as described above.

Then, the two beams (L₁ (1, −1), L₂ (−1, 1)) produce beat light of frequency of 200 KHz ($\Delta f=|F_1-F_2|=|2(f_1-f_2)|$) through the diffraction gratings (24, RM, WM). Such beat frequency is easy in signal processing.

Figure 11:
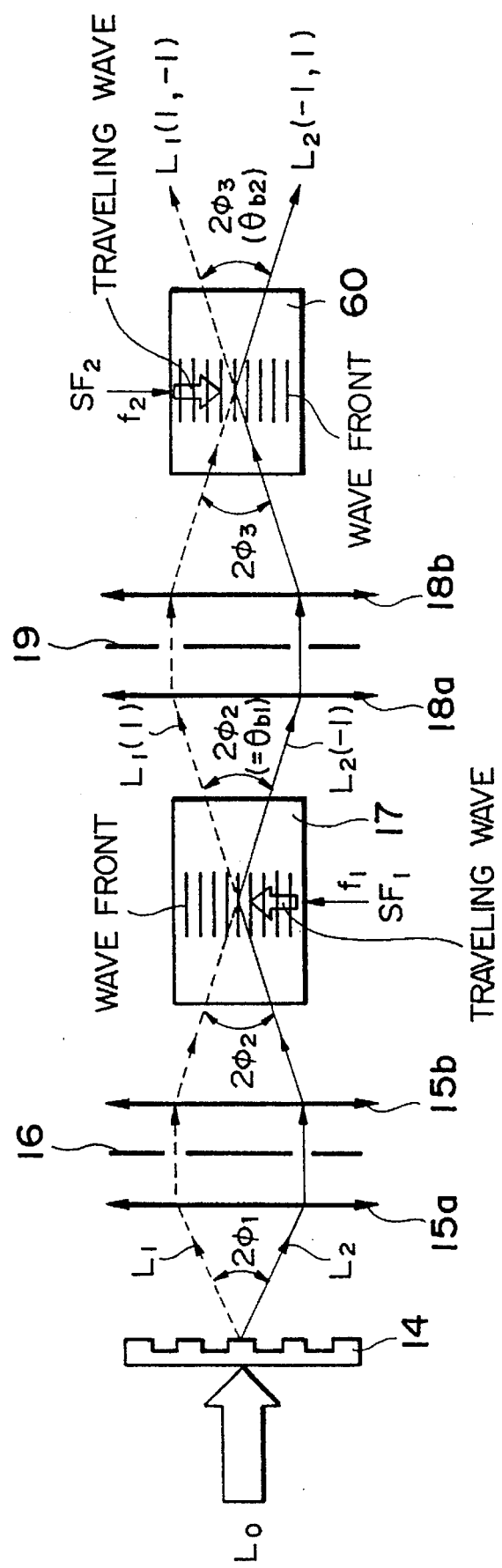
FIG. 11 is a drawing to show the structure of a double-beam producing portion (which is a portion producing two beams different in frequency from each other) in the second embodiment.

Next described with FIG. 11 is a more specific structure of the part for producing two beams different in frequency from each other in the second embodiment shown in FIG. 10.

As shown in FIG. 11, the second embodiment has such an arrangement that the diffraction grating 14, the first AOM 17 and the second AOM 60 are disposed in series and further that there are provided the first relay optical system (15a, 15b) for relaying the diffraction point of the diffraction grating 14 to the diffraction point of the first AOM 17 (in traveling path of high-frequency signal SF₁) and the second relay optical system (18a, 18b) for relaying the diffraction point of the first AOM 17 (in traveling path of high-frequency signal SF₁) to the,diffraction point of the second AOM 60 (in traveling path of high-frequency signal SF₂).

The white light (multi-wavelength light) L₀ normally illuminating the diffraction grating 14 produces ±1st order diffracted light (L₁, L₁) symmetric with each other at an angle $\Phi_1$ to the incident direction (direction of optical axis) by the diffraction effect of diffraction grating 14. The ±1st order diffracted light (L₁, L₁) is condensed by the first relay optical system (15a, 15b) to symmetrically enter the first AOM 17 at angle $\Phi_2$ to the direction of optical axis. Since the first AOM 17 is driven by a first high-frequency signal f₁, the beam L₁ is frequency-modulated to produce the first order diffracted light L₁ (1) of frequency ($f_0+f_1$) and the beam L₂ is frequency-modulated to produce the −1st order diffracted light L₂ (−1) of frequency ($f_0-f_1$). The beams (L₁ (1), L₂ (−1)) leave the first AOM symmetrically at angle $\Phi_2$ equal to the incident angle $\Phi_2$.

The beams L₁ (1) and L₂ (−1) optically-modulated by the first AOM 17 are condensed by the second relay optical system (18a, 18b) and then enter the second AOM 60 at angle $\Phi_3$ to the direction of optical axis. Since the second AOM 60 is driven by a second high-frequency signal f₂ in the opposite direction to that of first AOM 17, the beam L₁ (1) is frequency-modulated to produce −1st order diffracted light L₁ (1, −1) of frequency of $f_0+f_1-f_2$ (=F₁) and the beam L₂ (−1) is frequency-modulated to produce first order diffracted light L₂ (−1, 1) of frequency of $f_0-f_1+f_2$ (=F₂). The beams (L₁ (1, −1), L₂ (−1, 1)) leave the AOM 17 symmetrically at angle $\Phi_3$ equal to the incident angle $\Phi_3$.

With diffraction angle $\theta_{b2}$ (=2$\Phi_3$) by acoustic Bragg diffraction in AOM 60, velocity v₂ of ultrasonic wave (traveling wave) crossing the AOM 60, ultrasonic wave frequency f₂ of high-frequency signal SF₂, wavelength of light λ, and wavelength Λ₂ of ultrasonic wave (traveling wave) crossing the AOM 60, the following relations of Equations (15) and (16) may be established.

$$\Lambda_2=v_2/f_2 \qquad (15)$$

$$\sin\theta_{b2}=\lambda/\Lambda_2 \qquad (16)$$

From above Equations (15) and (16), the diffraction angle $\theta_{b2}$ (=2$\Phi_3$) by AOM 60 is finally obtained as in following Equation (17).

$$\sin\theta_{b2}=f_2\lambda/v_2 \text{ (or } \sin 2\Phi_3=f_2\lambda/v_2) \qquad (17)$$

If the second relay optical system (18a, 18b) has a magnification of β₂ and the second relay optical system (18a, 18b) satisfies the sine condition, the following relation of Equation (18) holds.

$$\beta_2=(\sin\Phi_2)/(\sin\Phi_3)\approx(\sin 2\Phi_2)/(\sin 2\Phi_3) \qquad (18)$$

Then, following Equation (19) may be derived from Equations (6), (17) and (18).

$$\beta_2=(v_2 f_1)/(v_1 f_2) \qquad (19)$$

As described, the second embodiment shown in FIG. 10 and FIG. 11 is preferably arranged such that the first relay optical system (15a, 15b) satisfies above Equation (8) and that the second relay optical system (18a, 18b) satisfies above Equation (19).

If the first and second AOMs (17, 60) are made of the same material and if there is a frequency difference of several ten KHz between the first and second high-frequency signals (f₁, f₂), $\beta_2\approx1$ from above Equation (19), whereby the second relay optical system may be constructed to have a magnification of $\beta_2=1$.

As described above, the second embodiment is arranged such that each detector (25, 33, 36) can photoelectrically detect beat light of multiple wavelengths including the predetermined frequency ($\Delta f=|2(f_1-f_2)|$) (plural components of respective wavelengths are detected each from the beat light including positional information of each diffraction grating), so that high-precision alignment can be achieved in heterodyne interference method while suppressing the influence of asymmetry of diffraction grating mark by averaging effect of beat light signals of respective wavelengths as well as the influence of thin film interference of resist with multiple wavelength light. In addition, the signal processing system can be simply constructed, because the beat frequency can be greatly lowered.

Further, since the white light (multi-wavelength light) symmetrically split by the diffraction grating 14 (beam splitting means) with respect to the incident direction (direction of optical axis) travels symmetrically and concurrently in the relay optical systems and the AOMs, there is no theoretical difference of optical path length between the split beams. Therefore, the split beams have respective wavefronts aligned with each other, that is, they have no phase difference, so that the apparatus may be easy in adjustment and compact in size as enabling high-precision alignment.

The second embodiment is so arranged that the diffraction light beams symmetrically traveling in the first and second AOMs (17, 60) with respect to the optical axis of second relay optical system (18a, 18b) are used as beams for alignment and that the signals of beat light of predetermined frequency ($\Delta f=|2(f_1-f_2)|$), which are produced by applying the two diffracted light beams onto each of diffraction gratings (24, RM, WM) in two directions, are extracted by the detectors (25, 33, 36) and the optical beat signal extracting portion (Fourier transform circuit) in phase difference detection system 50 to use the extracted signals for alignment. Its reason is as follows.

Since noise light produced by the first AOM 17 is the same as in FIGS. 8 and 9 as described above, it is omitted to explain here. Noise light produced by the second AOM 17 is described in the following with reference to FIGS. 17–15.

As shown in FIGS. 12–15, four beams of diffracted light produced by the first AOM 17 enter the second AOM 60, similarly as in FIGS. 8 and 9.

Figure 12:
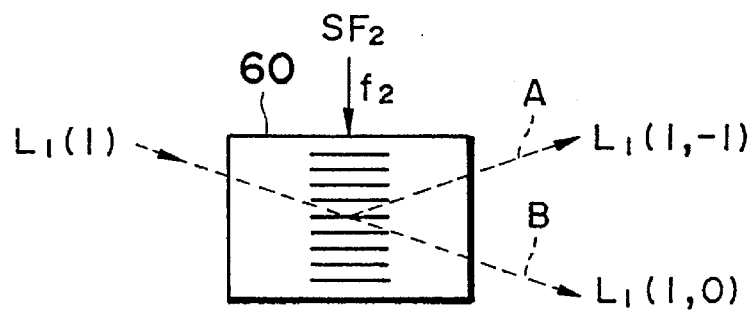
FIGS. 12–15 are drawings to show a situation to produce noise light in the second acousto-optic modulator in the second embodiment.

Specifically, as shown in FIG. 12, the beam $L_1$ (1) entering the second AOM 60 (first order diffracted light of the beam $L_1$) is Bragg-diffracted by the second AOM 60 to produce −1st order diffracted light $L_1$ (1, −1) in optical path A and zeroth order diffracted light $L_1$ (1, 0) in optical path B.

Figure 13:
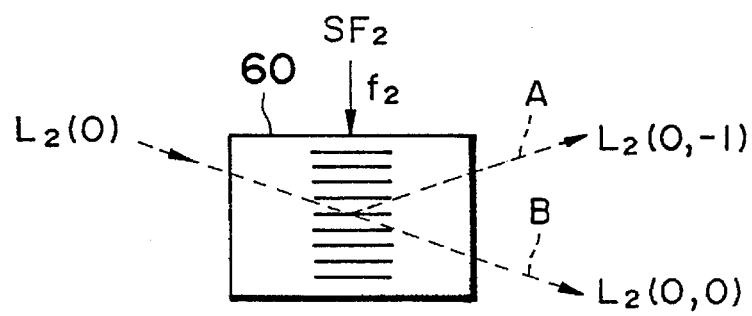

As shown in FIG. 13, the beam $L_2$ (0) entering the second AOM 60 (zeroth order diffracted light of the beam $L_2$) is Bragg-diffracted by the second AOM 60 to produce −1st order diffracted light $L_2$ (0, −1) in optical path A and zeroth order diffracted light $L_1$ (0, 0) in optical path B.

Figure 14:
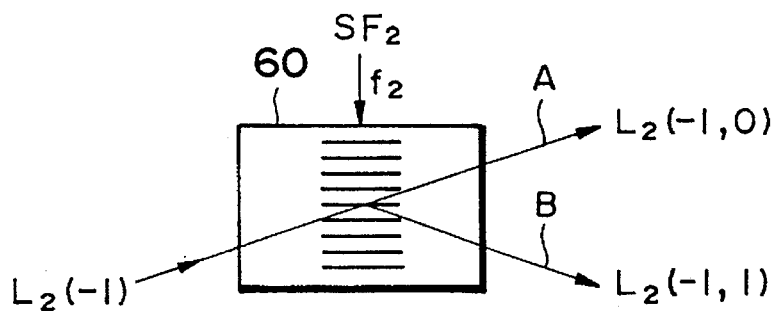

As shown in FIG. 14, the beam $L_2$ (−1) entering the second AOM 60 (−1st order diffracted light of the beam $L_2$) is Bragg-diffracted by the second AOM 60 to produce zeroth order diffracted light $L_2$ (−1, 0) in optical path A and +1st order diffracted light $L_2$ (−1, 1) in optical path B.

Figure 15:
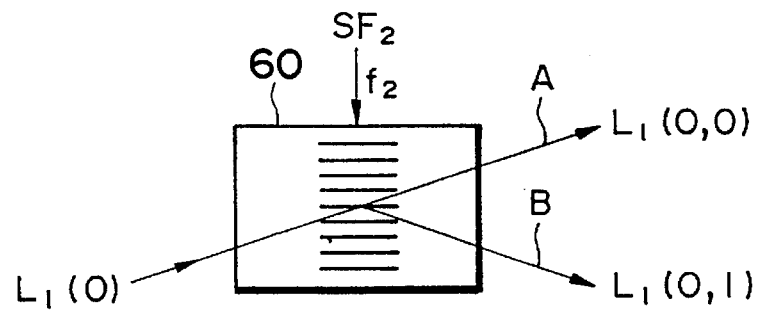

As shown in FIG. 15, the beam $L_1$ (0) entering the second AOM 60 (zeroth order diffracted light of the beam $L_1$) is Bragg-diffracted by the second AOM 60 to produce zeroth order diffracted light $L_1$ (0, 0) in optical path A and +1st order diffracted light $L_1$ (0, 1) in optical path B.

There are frequencies of the diffracted light components leaving the second AOM 60, as listed below for each of the optical paths (A, B).

In optical path A:
  frequency of −1st order diffracted light $L_1$ (1, −1) of beam $L_1$ (1): $f_0+f_1-f_2$ (I);
  frequency of −1st order diffracted light $L_2$ (0, −1) of beam $L_2$ (0): $f_0-f_2$ (II);
  frequency of zeroth order diffracted light $L_2$ (−1, 0) of beam $L_2$ (−1): $f_0-f_1$ (III);
  frequency of zeroth order diffracted light $L_1$ (0, 0) of beam $L_1$ (0): $f_0$ (IV).

In optical path B:
  frequency of zeroth order diffracted light $L_1$ (1, 0) of beam $L_1$ (1): $f_0+f_1$ (I');
  frequency of zeroth order diffracted light $L_2$ (0, 0) of beam $L_2$ (0): $f_0$ (II');
  frequency of first order diffracted light $L_2$ (−1, 1) of beam $L_2$ (−1): $f_0-f_1+f_2$ (III');
  frequency of first order diffracted light $L_1$ (0, 1) of beam $L_1$ (0): $f_0+f_2$ (IV').

The combination of the diffracted light components traveling in optical path A with the diffracted light components traveling in optical path B produces the following frequencies in beat light.

From the absolute value of difference between (I) and (I'), $$|(f_0+f_1-f_2)-(f_0+f_1)|=|f_2| \qquad [1].$$

From the absolute value of difference between (I) and (II'), $$|(f_0+f_1-f_2)-f_0|=|f_1-f_2| \qquad [2].$$

From the absolute value of difference between (I) and (III'), $$|(f_0+f_1-f_2)-(f_0-f_1+f_2)|=|2(f_1-f_2)| \qquad [3].$$

From the absolute value of difference between (I) and (IV'), $$|(f_0+f_1-f_2)-(f_0+f_2)|=|f_1-2f_2| \qquad [4].$$

From the absolute value of difference between (II) and (I'), $$|(f_0-f_2)-(f_0+f_1)|=|f_1+f_2| \qquad [5].$$

From the absolute value of difference between (II) and (II'), $$|(f_0-f_2)-f_0|=|f_2| \qquad [6].$$

From the absolute value of difference between (II) and (III'), $$|(f_0-f_2)-(f_0-f_1+f_2)|=|f_1-2f_2| \qquad [7].$$

From the absolute value of difference between (II) and (IV'), $$|(f_0-f_2)-(f_0+f_2)|=|2f_2| \qquad [8].$$

From the absolute value of difference between (III) and (I'), $$|(f_0-f_1)-(f_0+f_1)|=|2f_1| \qquad [9].$$

From the absolute value of difference between (III) and (II'), $$|(f_0-f_1)-f_0|=|f_1| \qquad [10].$$

From the absolute value of difference between (III) and (III'), $$|(f_0-f_1)-(f_0-f_1+f_2)|=|f_2| \qquad [11].$$

From the absolute value of difference between (III) and (IV'), $$|(f_0-f_1)-(f_0+f_2)|=|f_1+f_2| \qquad [12].$$

From the absolute value of difference between (IV) and (I'), $$|f_0-(f_0+f_1)|=|f_1| \qquad [13].$$

From the absolute value of difference between (IV) and (II'), $$|f_0-f_0|=0 \quad [14].$$

From the absolute value of difference between (IV) and (III'), $$|f_0-(f_0-f_1+f_2)|=|f_1-f_2| \quad [15].$$

From the absolute value of difference between (IV) and (IV'), $$|f_0-(f_0+f_2)|=|f_2| \quad [16].$$

Therefore, fifteen beat frequencies of [1]–[13], [15] and [16] are mixed in beat light photoelectrically detected by each of the detectors (25, 33, 36). If the diffracted light includes the frequency [14] and is photoelectrically detected by the detectors (25, 33, 36), it will be a direct current component (DC component). If it negatively affects the detection precision, it can be removed upon Fourier transform in the beat signal extracting portion in phase difference detection system 50. Alternatively, the direct current component may be removed by electrical filter means separately provided.

Since a beat frequency which can be used for alignment is one which is unique in the above beat frequencies without doubly appearing therein, there is only one beat frequency of $|2(f_1-f_2)|$ produced by a combination of beam $L_1$ (1, –1) with beam $L_2$ (–1, 1) in the second embodiment. Thus, the optical beat signal extracting portion (Fourier transform circuit) in phase difference detection system 50 extracts the signal of beat frequency of $|2(f_1-f_2)|$.

Even if beat light signals having various beat frequencies are photoelectrically detected by the detectors (25, 33, 36), high-precision alignment can be achieved by heterodyne interference based on the signal of predetermined beat frequency ($|2(f_1-f_2)|$) extracted by the optical beat signal extracting portion (Fourier transform circuit).

If the second embodiment is so modified, as in the first embodiment, that at least either one of the diffraction grating 14 and the first AOM 17 is rotated to make the traveling direction of traveling wave crossing the first AOM 17 different from the pitch direction of diffraction grating 14, the unnecessary diffracted light component $L_2$ (0) traveling in optical path A of beam $L_1$ (1) and the unnecessary diffracted light component $L_1$ (0) traveling in optical path B of beam $L_2$ (–1) can be separated out and then filtered by the space filter 19.

Further, if either one of the first AOM 17 and the second AOM 60 is rotated so that the traveling direction of traveling wave crossing the first AOM 17 is made different from that of traveling wave crossing the second AOM 60, the unnecessary diffracted light component $L_2$ (–1, 0) traveling in optical path A of beam $L_1$ (1, –1) and the unnecessary diffracted light component $L_1$ (1, 0) traveling in optical path B of beam $L_2$ (–1, 1) as shown in FIG. 12 and FIG. 13 can be separated out and filtered by the space filter 61.

Even in case that the traveling direction of traveling wave crossing the first AOM 17 is made identical to that of traveling wave crossing the second AOM 60 and if the pitch direction of diffraction grating 14 is made different from the traveling direction of traveling waves crossing the two AOMs, the unnecessary diffracted light components can be also removed by the space filters (19, 61), of course.

Now let us consider a general case that n AOMs are arranged in series and n relay optical systems are arranged for relay, one between the beam splitting means (diffraction grating 14) and the first AOM and the others between AOMs.

Let a frequency $B_f$ be a frequency of beat light to be extracted. Since the diffracted light symmetrically traveling with respect to the optical axis of each relay optical system can be used as illumination beams for alignment, the frequency $B_f$ of beat light to be extracted is generally expressed by following Equation (20).

$$B_f=|2(f_1+f_2+f_3\ldots f_n)| \quad (20)$$

In the above equation, $f_n$ represents a drive frequency of n-th AOM from the light source side, which is positive when the drive frequency is applied in the first direction but negative when the drive frequency is applied in the second direction opposite to the first direction.

Also, the magnification $\beta_1$ of first relay optical system is as defined in Equation (8), and a magnification $\beta_n$ of n-th relay optical system is defined by following Equation (21).

$$\beta_n=(v_n f_{n-1})/(v_{n-1} f_n) \quad (21)$$

Although the second embodiment shown in FIG. 10–FIG. 15 shows such an example that two beams of ±1st order diffracted light split by the diffraction effect of diffraction grating 14 are guided to enter the first AOM 17, that two beams, which are +1st order diffracted light from one of the two beams diffracted through the first AOM 17 and –1st order diffracted light from the other of the two beams diffracted through the first AOM 17, are guided to enter the second AOM 60, and that the +1st order diffracted light from the one of two beams diffracted through the second AOM 60 and the –1st order diffracted light from the other of two beams diffracted through the second AOM 60 are guided to irradiate marks for position detection in two directions, the invention is not limited to this example. For example, two diffracted light beams of arbitrary order produced by the diffraction grating 14 may be used as two beams for position detection while guided to enter the first AOM 17. Also, a diffraction light beam of arbitrary order from one of two beams diffracted through the first AOM 17 and a diffracted light beam of arbitrary order from the other of two beams diffracted through the first AOM 17 can be used as two beams for position detection as guided to enter the second AOM 60. Further, a diffracted light beam of arbitrary order from one of two beams diffracted through the second AOM 60 and a diffracted light beam of arbitrary order from the other of two beams diffracted through the second AOM 60 can be used as two beams for position detection as guided to illuminate the marks for position detection in two directions.

Also, although the second embodiment shown in FIG. 10 shows an example in which the light source means (10–12) supplies a beam including light of plural wavelengths (multiple wavelengths), the invention is not limited to this example. The alignment can be achieved in heterodyne interference method with laser source supplying light of single wavelength as light source means. In this case, the advantage in the heterodyne interference method using the multi-wavelength light cannot be enjoyed in alignment. However, by arranging in series the diffraction grating 14 and the first acousto-optic modulator 17 on either side of the first relay optical system (15a, 15b) and also by arranging in series the first acousto-optic modulator 17 and the second acousto-optic modulator 60 on either side of second relay optical system (18a, 18b), two beams different in frequency from each other as beat down can be produced without difference of optical path length, whereby the apparatus may be simple in construction and remarkably easy in adjustment, as compared with the conventional apparatus.

Third Embodiment

Figure 16:
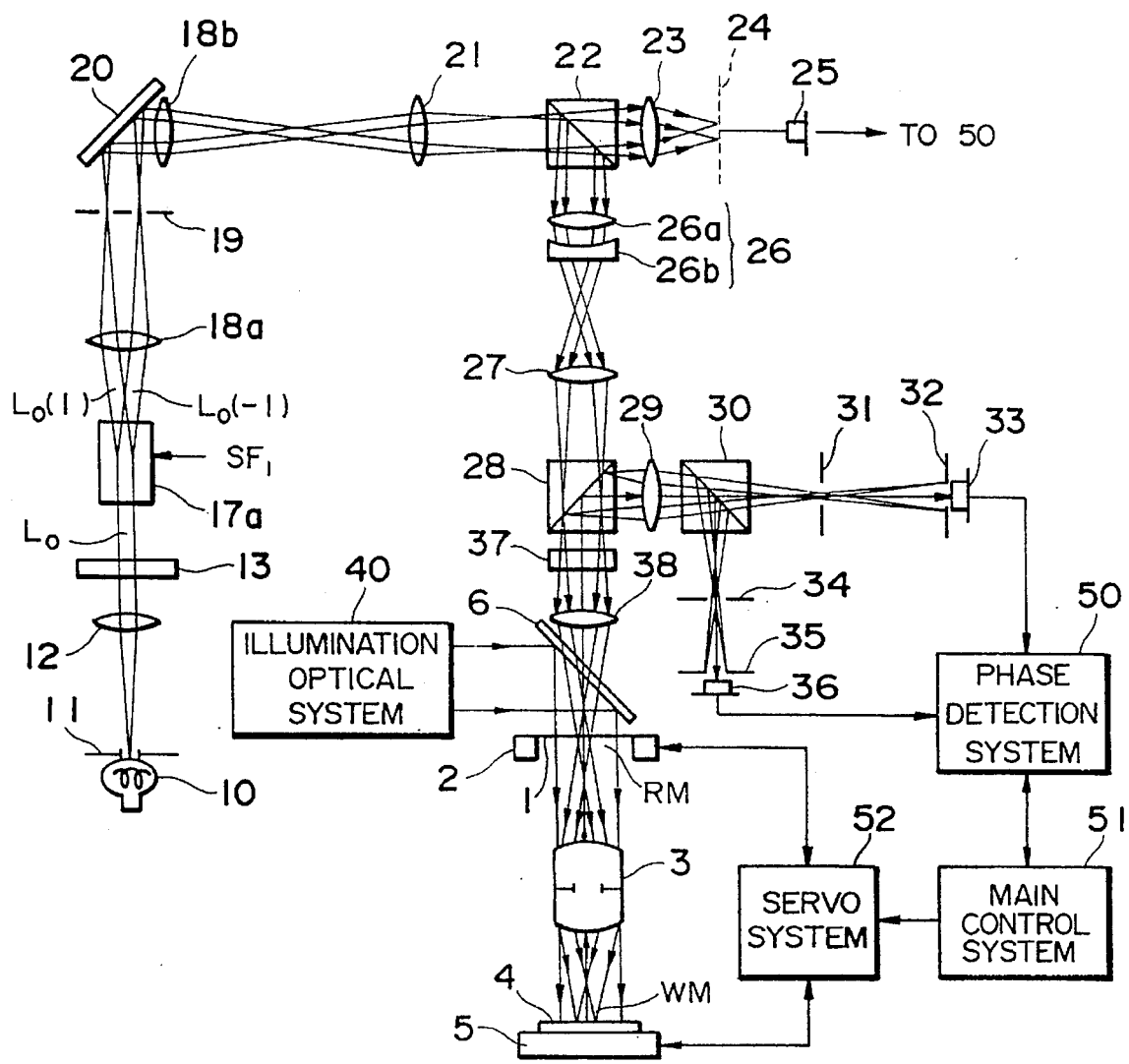
FIG. 16 is a schematic constitutional drawing to show a projection exposure apparatus to which the first embodiment of position detecting apparatus according to the present invention is applied.

The third embodiment according to the present invention will be described with reference to FIG. 16. The present embodiment employs the third type frequency difference producer as described before. In FIG. 16, members having the same functions as those in the first embodiment shown in FIG. 1 are given the same reference numerals.

The present embodiment is different from the first embodiment in that an acousto-optic element 17a replaces the diffraction grating 14, the relay optical system (condenser lens 15a, space filter 16 and condenser lens 15b) and the AOM 17 in the first embodiment.

In the alignment optical system of the present embodiment, a white light source 10 is a light source such as a Xe lamp and a halogen lamp supplying light different in wavelength band from exposure light. After white light from the white light source 10 is converted into a collimated beam $L_0$ through an aperture-variable diaphragm 11 and a condenser lens 12, the beam is guided through a band-pass filter 13, which extracts light in predetermined wavelength range, then to enter the AOM 17a in parallel with the wavefront of traveling wave.

The AOM 17a is driven by a high-frequency signal $SF_1$ of frequency $f_1$, so that the beam $L_0$ in predetermined wavelength range is subjected to the Raman-Nath diffraction effect in AOM 17a.

Supposing the beam $L_0$ in predetermined wavelength range has a frequency of $f_0$, the beam $L_0$ is frequency-modulated by AOM 17a to produce +1st order diffracted light $L_0$ (1) (as will be referred to as "beam $L_0$ (1)") of frequency $(f_0+f_1)$ and $-1$st order diffracted light $L_0$ (−1) (as will be referred to as "beam $L_0$ (−1)") of frequency $(f_0-f_1)$.

After that, the beams $L_0$ (1) and $L_0$ (−1) will be treated in the same manner as in the first embodiment.

Figure 17:
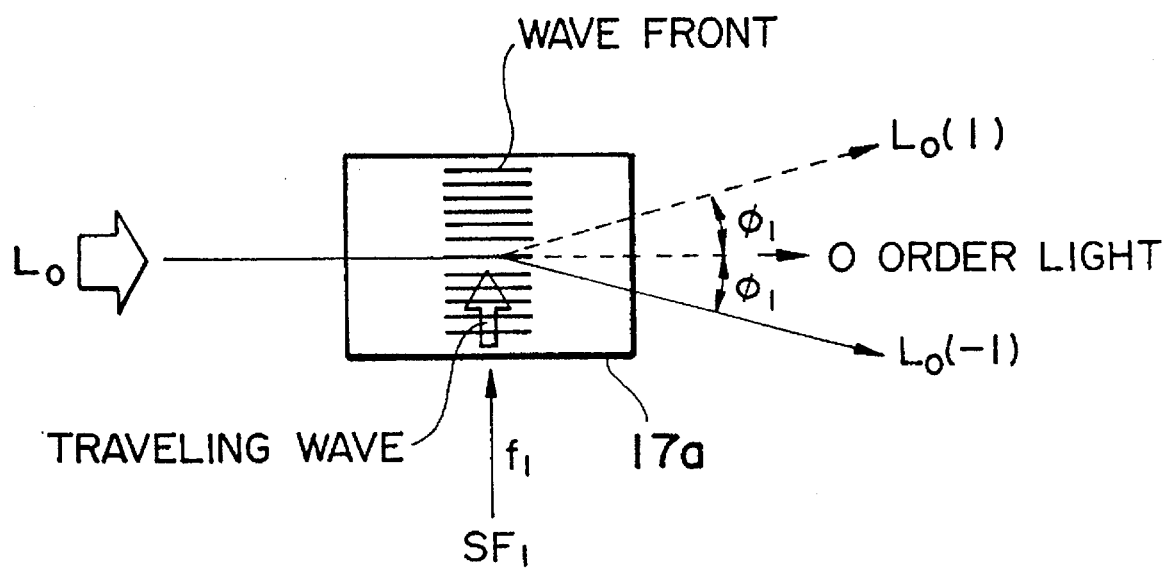
FIG. 17 is a drawing to illustrate the operation of acousto-optic modulator 17a in the third embodiment.

Next described with FIG. 17 is a more specific structure of the portion for producing two beams different in frequency from each other in the third embodiment shown in FIG. 16, and the principle thereof.

FIG. 17 shows the acousto-optic modulator (AOM) 17a in FIG. 16. As shown in FIG. 17, the white light $L_0$ enters the AOM 17a in parallel with the wavefront of traveling wave therein. As a result, diffracted light of various orders are produced from each wavefront by diffraction effect (Raman-Nath diffraction) of AOM 17a.

Letting a diffraction angle of N-th order diffracted light from incident light of wavelength $\lambda$ be $\Phi_1$ and a pitch of traveling wave be $\Lambda_1$, the following equation holds.

$$\sin \Phi_1 = N\lambda/\Lambda_1 \quad (22)$$

The following equation holds as to the pitch $\Lambda_1$ of traveling wave with velocity $v_1$ and frequency $f_1$ of traveling wave.

$$\Lambda_1 = v_1/f_1 \quad (23)$$

Accordingly, Equation (22) may be rewritten into Equation (24) for ±1st order diffracted light.

$$\sin \Phi_1 = f_1 \lambda / v_1 \quad (24)$$

Now discussed is a diffraction angle of ±1st order light $L_0$ (1) and $L_0$ (−1) passing through the space filter 19 in FIG. 16. For example, if the base wavelength $\lambda_0$ of irradiation light is 633 nm, a width of wavelength band ±50 nm, and the pitch $\Lambda_1$ of traveling wave in AOM 17a 40 μm, then the diffraction angle of ±1st order light is 0.835° for shortest wavelength of 583 nm and 0.978° for longest wavelength of 683 nm. Thus, with light of 583–683 nm the diffraction angle of ±1st order light is distributed in a range of 0.835°–0.978°. As the incident light is diffracted by the traveling wave in AOM 17, the diffracted light is modulated by the amount of frequency of traveling wave therein.

Figure 18:
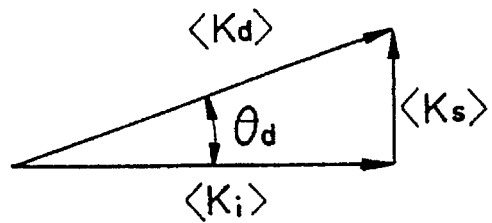
FIG. 18 is an explanatory drawing of the theory of Raman-Nath diffraction by acousto-optic modulator.

Next described with FIG. 18 is the optical frequency modulation by the Raman-Nath diffraction. In FIG. 18 the angle $\theta_1$ is 0° between the incident light and the wavefront of traveling wave of ultrasonic wave caused by the drive signal $SF_1$ in AOM 17a. Further, the angle is $\theta_d$ between the diffracted light and the wavefront of traveling wave of ultrasonic wave caused by the drive signal $SF_1$ in AOM 17a, a wave vector of incident light into AOM 17a $<K_i>$, a wave vector of diffracted light by AOM 17a $<K_d>$, and a wave vector of ultrasonic wave by drive signal $SF_1$ $<K_s>$.

In the Raman-Nath diffraction, the angle $\theta_d$ is small, so that the vectors are in relation of isosceles triangle as shown in FIG. 18. If a wavelength of light is $\lambda$, if an index of diffraction of AOM 17a is n, if a frequency of ultrasonic wave is $f_1$, and if a velocity of ultrasonic wave (traveling wave) crossing the AOM 17a is $v_1$, then amplitudes of vectors $<K_i>$, $<K_d>$ and $<K_s>$ may be expressed as follows.

$$|<K_i>|=2\pi n/\lambda \quad (25)$$

$$|<K_d>|=2\pi n/\lambda \quad (26)$$

$$|<K_s>|=2\pi f_1/v_i \quad (27)$$

With wavelength $\Lambda_1$ of traveling wave of ultrasonic wave, the following relations hold.

$$\sin \theta_d = \lambda/\Lambda_1 \quad (28)$$

$$|<K_s>|=\sin \theta_d \cdot |<K_d>| \quad (29)$$

Equation (30) may be derived from Equations (28) and (29).

$$|<K_s>|=2\pi n/\Lambda_1 \quad (30)$$

As seen from Equation (30), the amplitude of $\{<K_s>\}$ is constant irrespective of wavelength of light as far as the condition of Raman-Nath diffraction is satisfied. It can be, therefore, understood that light which is to be diffracted by AOM 17a is subjected to the same frequency modulation ($f_1$) regardless of wavelength of light.

Thus, if the frequency of beam $L_0$ incident into AOM 17a is f, the +1st order diffracted light $L_0$ (1) from beam $L_0$ is equally frequency-modulated as $(f+f_1)$ $(=F_1)$ for each wavelength and the −1st order diffracted light $L_0$ (−1) from the beam $L_0$ is also equally frequency-modulated as $(f-f_1)$ $(=F_2)$ for each wavelength.

As described, the +1st order diffracted light $L_0$ (1) of frequency $F_1$ having a certain wavelength range and the −1st order diffracted light $L_0$ (−1) of frequency $F_2$ having a certain wavelength range can be used to irradiate the diffraction gratings (24, RM, WM) symmetrically with light component of each wavelength at an incident angle different from others, so that ±1st order diffracted light Of each wavelength can be always produced in the direction normal to each of the diffraction gratings (24, RM, WM). Consequently, beat light including a predetermined frequency $\Delta f$ $(=|F_1-F_2|=|2f_1|)$ may be produced from the ±1st order diffracted light of each wavelength. Accordingly, since each detector (25, 33, 36) can photoelectrically detect the beat light of multiple wavelengths including the predetermined frequency $\Delta f$ $(=|F_1-F_2|=|2f_1|)$ (beat light signals of plural wavelengths including positional information of each diffraction grating are detected), high-precision alignment can be achieved in heterodyne interference method while suppressing the influence of asymmetry of diffraction grating mark by averaging effect of beat light signals of multiple wavelengths and the influence of thin film interference of resist (influence such as a change in light quantity) with the multi-wavelength light.

In addition, the light diffracted by AOM 17a then travels symmetrically with respect to the optical axis, so that there is no theoretical difference of optical path length between the split beams. In other words, the double-beam interference becomes possible even with white light short in interference distance. Also, since the wavefronts of the split beams are aligned with phase difference being zero, the apparatus can be easy in adjustment and compact in size while enabling high-precision alignment.

The present embodiment is so arranged that the beams of ±1st order diffracted light $L_0$ (1), $L_0$ (−1) symmetrically leaving and optically modulated by AOM 17a are used as beams for alignment, the ±1st order diffracted light $L_0$ (1), $L_0$ (−1) are guided to irradiate the diffraction gratings (24, RM, WM) in two directions to obtain signals of beat light of predetermined frequency $\Delta f$ (=|2$f_1$|), and the signals are extracted through the detectors (25, 33, 36) and the optical beat signal extracting portion (Fourier transform circuit) in phase difference detection system 50 to use the extracted signals as signals for alignment. As so arranged, high-precision alignment can be achieved by heterodyne interference.

Although the present embodiment shows an example in which the ±1st order diffracted light beams split and produced by the Raman-Nath diffraction effect of AOM 17a are used as two beams for position detection as to irradiate the marks for position detection in two directions, the invention is not limited to this example. For example, any two diffracted light components of arbitrary order produced by the acoustic-optic modulator 17a may be used as two beams for position detection as to irradiate the marks for position detection in two directions.

Fourth Embodiment

Figure 19:
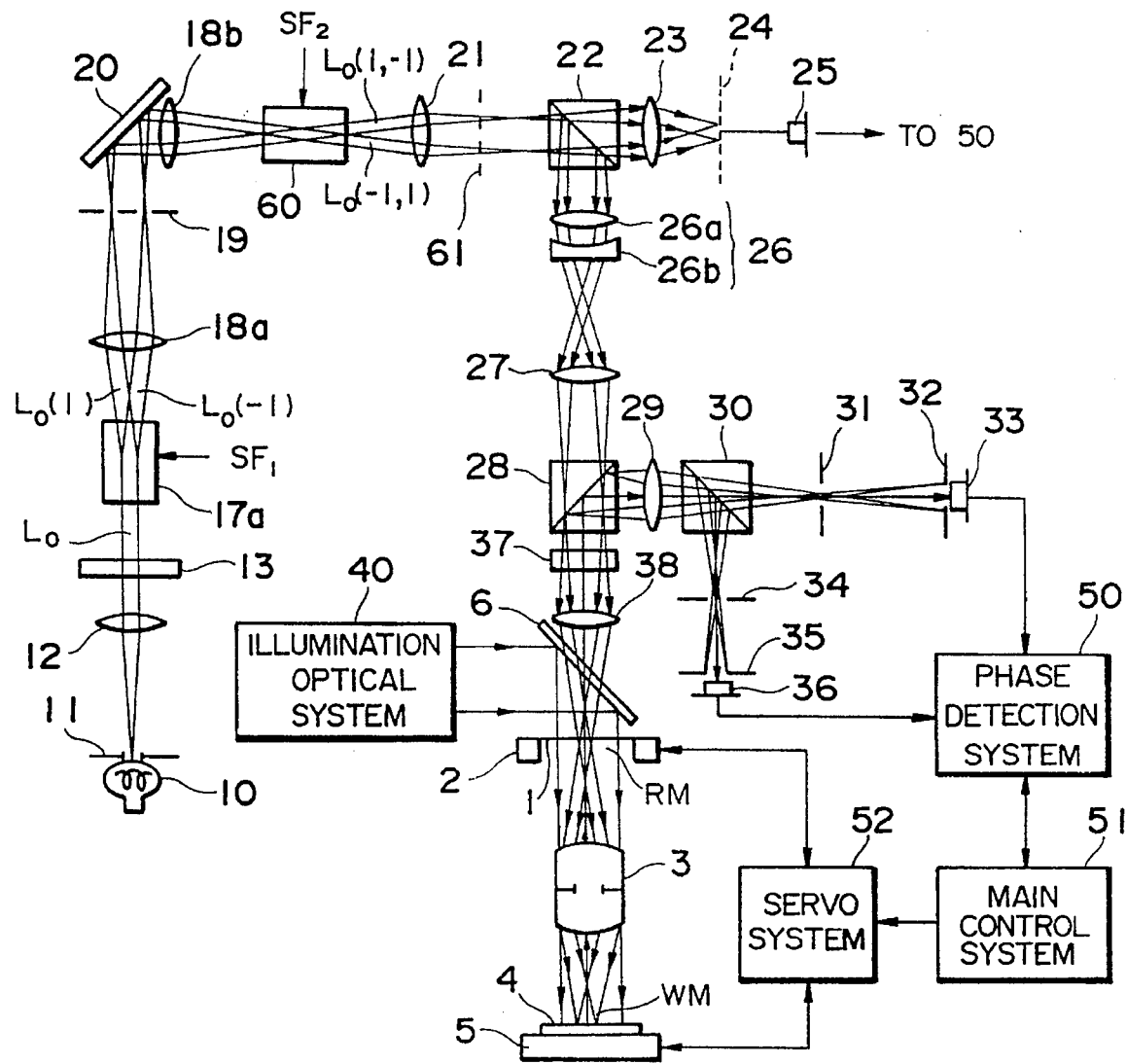
FIG. 19 is a schematic constitutional drawing to show a projection exposure apparatus in the fourth embodiment of the present invention.

The fourth embodiment of the present invention will be described referring to FIG. 19 and FIG. 20. The present embodiment employs the fourth type frequency difference producer as described before. In FIG. 19, members having the same functions as those in the first embodiment shown in FIG. 1 and in the third embodiment shown in FIG. 16 are given the same reference numerals, and the details thereof will be omitted to explain. The present embodiment is different from the third embodiment, as the second embodiment is different from the first embodiment, in that a second acousto-optic modulator 60 (as will be referred to as "AOM 60") is provided between the relay optical system (18a, 18b) and the condenser lens 21, that a space filter 61 is provided between the condenser lens 21 and the beam splitter 22, and that the lenses 18a and 18b serve as a relay optical system for relaying the diffraction point of first AOM 17a (first acousto-optic modulator) to the diffraction point of second AOM 60 (second acousto-optic modulator).

In the present embodiment, a high-frequency signal $SF_2$ applied to the second AOM 60 travels in the direction opposite to the traveling direction of high-frequency signal $SF_1$ applied to the first AOM 17a so as to lower beat frequency finally obtained (below 1 MHz), whereby facilitating the processing of electric signals.

As shown in FIG. 19, white light from white light source 10 supplying light in a wavelength band (multiple wavelengths) different from that of exposure light is guided to pass through a variable aperture 11, a condenser lens 12 and a band-pass filter 13 then to enter the first AOM 17a. The incident light is guided to enter the first AOM 17a in parallel with the wavefront of traveling wave so that the Raman-Nath diffraction is effected in AOM 17a.

Since the first AOM 17a is driven by the first high-frequency signal $SF_1$ of frequency $f_1$, a beam $L_0$ (1), which is +1st order diffracted light of the beam $L_0$ in predetermined wavelength range, and a beam $L_0$ (−1), which is −1st order diffracted light of beam $L_0$, are subjected to frequency modulation of ($f_0+f_1$) and ($f_0-f_1$), respectively, in the first AOM 17a. After that, the beams $L_0$ (1) and $L_0$ (−1) are guided to pass through a lens 18a, a reflection mirror 20 and a lens 18b then to enter the second AOM 60 symmetrically at equal incident angle. A space filter 19 disposed in the relay optical system (18a, 18b) extracts ±1st order diffracted light beams $L_0$ (1), $L_0$ (−1) leaving first AOM 17a.

The present embodiment is so arranged that the beams $L_0$ (1) and $L_0$ (−1) entering the second AOM 60 satisfy the condition of acoustic Bragg diffraction. Since the second AOM 60 is driven by the second high-frequency signal $SF_2$ of frequency $f_2$ moving in the direction opposite to the traveling direction in first AOM 17a, −1st order diffracted light $L_0$ (1, −1) (as will be referred to "beam $L_0$ (1, −1)") of the beam $L_0$ (1) in predetermined wavelength range is subjected to frequency modulation of ($f_0+f_1-f_2$) (=$F_1$) by the second AOM 60, and +1st order diffracted light $L_0$ (−1, 1) (as will be referred to as "beam $L_0$ (−1, 1)") of the beam $L_0$ (−1) in predetermined wavelength range is also subjected to frequency modulation of ($f_0-f_1+f_2$) (=$F_2$) by the second AOM 60. Then, the beams $L_0$ (1, −1) and $L_0$ (−1, 1) respectively pass through a lens 21 and are then split into two by a beam splitter 22. The space filter 61 is provided in the relay optical system (21, 23) to extract the −1st order diffracted light $L_0$ (1, −1) and the +1st order diffracted light $L_0$ (−1, 1) leaving from second AOM 60.

The two beams thus split by the beam splitter 22 are photoelectrically detected finally by the detectors (25, 33, 36) in the same manner as in the third embodiment shown in FIG. 16, the details of which are omitted to explain herewith. In the present embodiment, from photoelectric signals photoelectrically detected by each detector (25, 33, 36), beat signals of predetermined frequency $\Delta f$ (=|$F_1-F_2$|= 2($f_1-f_2$)|) arising from a light component of each wavelength are extracted by the optical beat signal extracting portion (Fourier transform circuit) in phase difference detection system 50 to carry out alignment based on these signals.

As described above, the present embodiment is so arranged that the two AOMs 17a, 60 are arranged in series and that the high-frequency signals $SF_1$, $SF_2$ are applied to the AOMs in the opposite directions, whereby enabling the frequency of beat signals photoelectrically detected by the detectors (25, 33, 36) to be lowered below 1 MHz, which is easy in signal processing.

Supposing the first AOM 17a is driven by a first high-frequency signal $SF_1$ of frequency $f_1$ of 100 MHz and the second AOM 60 is driven by a second high-frequency signal $SF_2$ of frequency $f_2$ of 99.9 MHz in the direction opposite to that in first AOM 17a, the frequency of one beam $L_0$ (1, −1) passing through the second AOM 60 is $F_1$ (=$f_0+f_1-f_2$) and the frequency of the other beam $L_0$ (−1, 1) passing through the second AOM 60 is $F_2$ (=$f_0-f_1+f_2$), as described above.

Then, the frequency $\Delta f$ of beat light, which is produced by each diffraction grating (24, RM, WM) with irradiation of the two beams $L_0$ (1, −1) and $L_0$ (−1, 1), will be 200 KHz (=|$F_1-F_2$|=2($f_1-f_2$)|), which is a beat frequency easy in signal processing.

Figure 20:
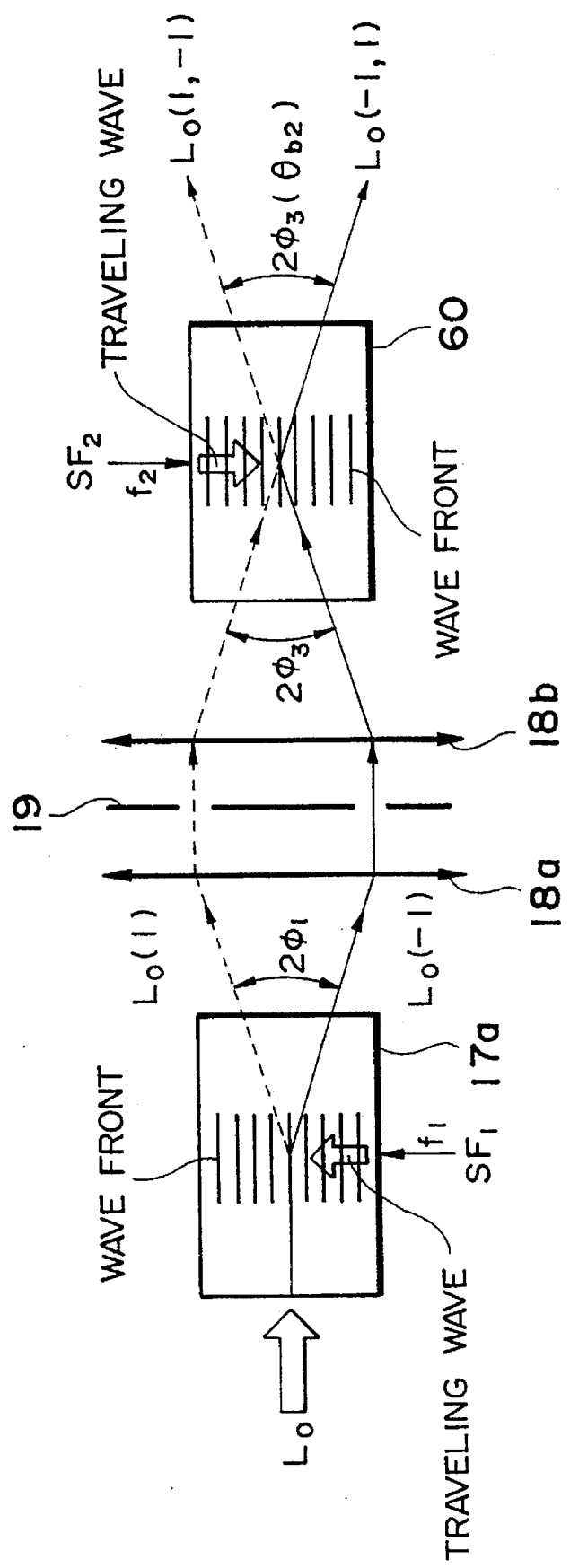
FIG. 20 is a drawing to illustrate the operation of two acousto-optic modulators 17a and 60 in the fourth embodiment.

Next described with FIG. 20 is a more specific structure of the portion for producing two beams different in frequency from each other in the present embodiment shown in FIG. 19.

As shown in FIG. 20, the present embodiment is so arranged that the first AOM 17a and the second AOM 60 are arranged in series and that the relay optical system (18a,

18b) is provided for relaying the diffraction point of first AOM 17a (in traveling path of high-frequency signal $SF_1$) to the diffraction point of second AOM 60 (in traveling path of high-frequency signal $SF_2$). The beam $L_0$ of white light (multi-wave light) enters the first AOM 17a in parallel with the wavefront of traveling wave therein. Then, the beam $L_0$ is subjected to the Raman-Nath diffraction by first AOM 17a.

Since the first AOM 17a is driven by the first high-frequency signal $f_1$, the +1st diffracted light $L_0$ (1) of the beam $L_0$ is frequency-modulated to have a frequency $(f_0+f_1)$ and the −1st diffracted light $L_0$ (−1) of the beam $L_0$ is frequency-modulated to have a frequency $(f_0-f_1)$. The beams $L_0$ (1) and $L_0$ (−1) leave the first AOM 17a as inclined symmetrically at angle $\Phi_1$ with respect to the incident optical axis and as also being symmetric with respect to the wavefront of traveling wave.

The beams $l_0$ (1) and $L_0$ (−1) optically modulated by first AOM 17a are condensed by the first relay optical system (18a, 18b) then to enter the second AOM 60 symmetrically at angle $\Phi_3$ with respect to the direction of optical axis. Since the second AOM 60 is driven by the second high-frequency signal $f_2$ in the direction opposite to that in the first AOM 17a, −1st diffracted light $L_0$ (1, −1) of the beam $L_0$ (1) is frequency-modulated to have a frequency $(f_0+f_1-f_2)$ $(=F_1)$ and +1st order diffracted light $L_0$ (−1, 1) of the beam $L_0$ (−1) is frequency-modulated to have a frequency $(f_0-f_1+f_2)$ $(=F_2)$. The beams $L_0$ (1, −1) and $L_0$ (−1, 1) leave the second AOM 60 symmetrically at angle $\Phi_3$ equal to the incident angle $\Phi_3$. In other words, the beams $L_0$ (1, −1) and $L_0$ (−1, 1) are respectively subjected to the acoustic Bragg diffraction in the second AOM 60.

If the diffraction angle by the acoustic Bragg diffraction of second AOM 60 is $\theta_{b2}$ $(=2\Phi_3)$, if a velocity of ultrasonic wave (traveling wave) crossing the second AOM 60 is $v_2$, if an ultrasonic wave frequency of high-frequency signal $SF_2$ is $f_2$, if a wavelength of light is $\lambda$, and if a wavelength of ultrasonic wave (traveling wave) crossing the second AOM 60 is $\Lambda_2$, then the following relations of Equations (31) and (32) hold.

$$\Lambda_2 = v_2/f_s \tag{31}$$

$$\sin\theta_{b2} = \lambda/\Lambda_2 \tag{32}$$

From Equations (31) and (32), the diffraction angle $\theta_{b2}$ $(=2\Phi_3)$ by the second AOM 60 is finally obtained as in following Equation (33).

$$\sin\theta_{b2} = f_2\lambda/v_2 \text{ (or } \sin 2\Phi_3 = f_2\lambda/v_2) \tag{33}$$

If the relay optical system (18a, 18b) has a magnification of $\beta_1$ and satisfies the sine condition, the following relation of Equation (34) holds.

$$\beta_1 = (\sin\Phi_1)/(\sin\Phi_3) \tag{34}$$
$$\approx (2\sin\Phi_1)/(\sin 2\Phi_3)$$

Accordingly, following Equation (35) is derived from Equations (24), (33) and (34).

$$\beta_1 = 2\cdot(v_2 f_1)/(v_1 f_2) \tag{35}$$

Therefore, the present embodiment shown in FIG. 19 and FIG. 20 is preferably constructed such that the relay optical system (18a, 18b) satisfies above Equation (35).

If the first and second AOMs (17a, 60) are made of the same material and if there is a frequency difference of several ten KHz between the first and the second high-frequency signals $(f_2, f_1)$, $\beta_1$ in Equation (35) is calculated as $\beta_1 \approx 2$. Thus, the relay optical system (18a, 18b) may be constructed with magnification $\beta_1$ equal to 2.

According to the present embodiment, as described above, each detector (25, 33, 36) can photoelectrically detect beat light of multiple wavelengths including the predetermined frequency $\Delta f$ $(=|2(f_1-f_2)|)$ (by detecting plural beat light signals of respective wavelengths including information on position of each diffraction grating), so that high-precision alignment can be achieved in heterodyne interference method while suppressing the influence of asymmetry of diffraction grating mark by averaging effect of beat light signals of various wavelengths and the influence of thin film interference of resist on wafer 4 with multi-wavelength light. In addition, the beat frequency can be greatly lowered, whereby the signal processing system can be simplified.

Further, the white light (multi-wavelength light) travels symmetrically and concurrently through the relay optical systems and the AOMs, so that there is no theoretical difference of optical path length between the split beams. Therefore, the double-beam interference is possible even with a beam having a short coherence length such as white light. Also, since the wavefronts of the split beams are aligned, that is, since they have no phase difference, the apparatus can be constructed as easy in adjustment and compact in size while enabling the high-precision alignment.

Fifth Embodiment

The fifth embodiment is constructed by the same members as in the first embodiment as shown in FIG. 1. The fifth embodiment is different from the first embodiment in that the traveling direction of acoustic signal $(SF_1)$ applied to the acousto-optic modulator (AOM) 17 is changed.

In case that the traveling direction of traveling wave in AOM 17 is set in parallel with the pitch direction of diffraction grating 14 as in the first embodiment, the zeroth order diffracted light is mixed in the ±1st order diffracted light so as to produce a beat signal of unnecessary frequency.

Figure 21:
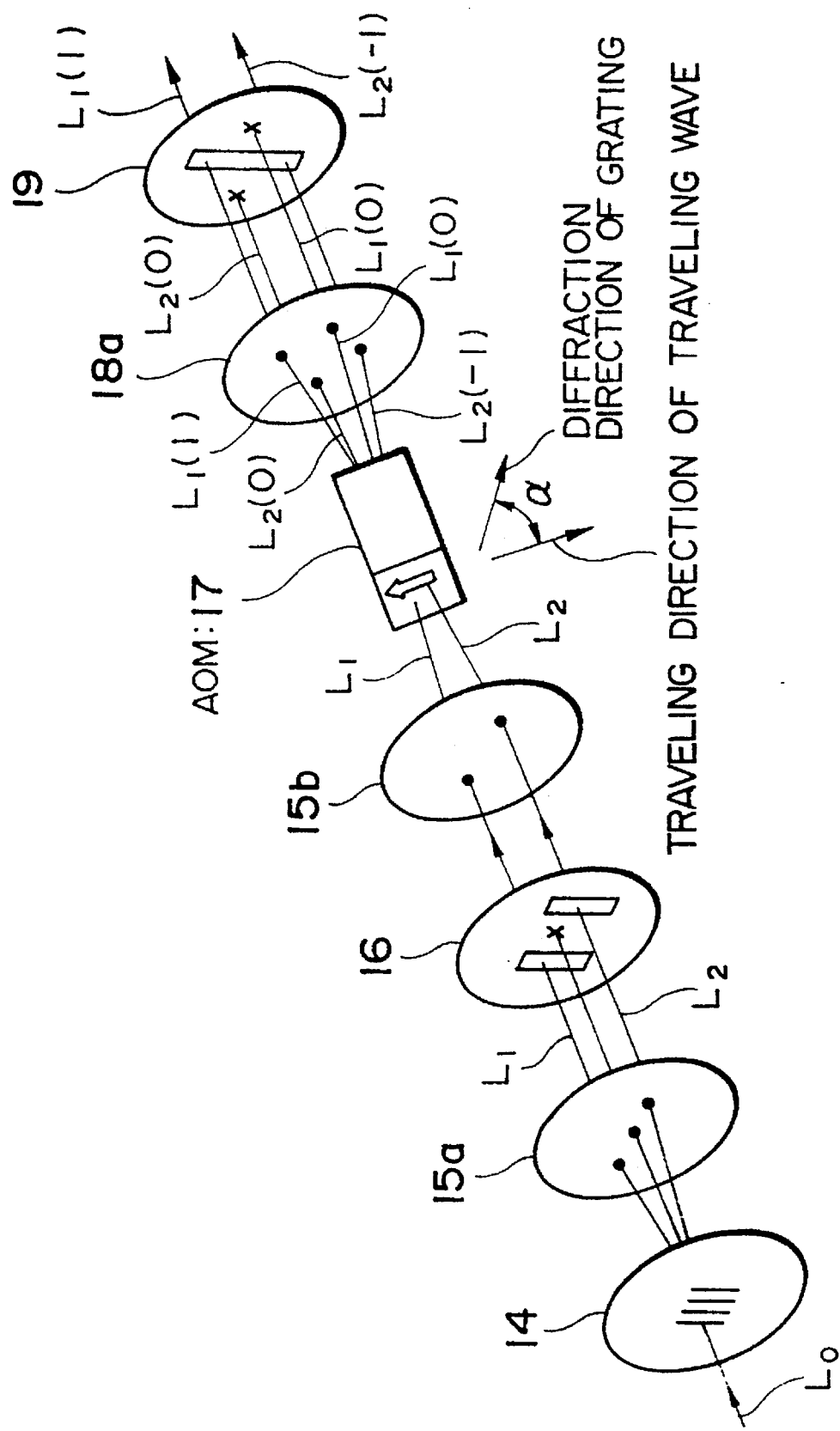
FIG. 21 is a perspective view to show an arrangement of optical members of from diffraction grating 14 to space filter 19 in the fifth embodiment.

In order to avoid the unnecessary beat signal, the present embodiment is so arranged, as shown in FIG. 21, that the traveling direction of traveling wave crossing the AOM 17 with high-frequency signal for drive is made different from the pitch direction of diffraction grating 14 (orientation of gratings).

FIG. 21 shows the actual arrangement of optical members from the diffraction grating 14 and the space filter 19 in FIG. 1. In FIG. 21, the traveling direction of traveling wave in AOM 17 is deviated by a predetermined angle to the pitch direction of diffraction grating 14 (diffraction direction). By this arrangement, unnecessary zeroth order diffracted light beams $L_2$ (0) and $L_1$ (0) leave the AOM 17 in the direction different from that of the diffracted light $L_1$ (1) or $L_2$ (−1), so that the space filter 19 can remove only the unnecessary zeroth order diffracted light components $L_2$ (0) and $L_1$ (0). In this case, it is necessary for a diffraction angle of the beams $L_1$, $L_2$ split by the diffraction grating 14 to have a directional component in the direction of traveling wave in AOM 17 (Bragg angle component) equivalent to the Bragg angle at AOM 17.

If the diffraction angle by the diffraction grating 14 is $\Phi_1$ and if the angle is $\alpha$ between the diffraction direction by the diffraction grating 14 (direction of a plane including diffracted light of respective orders produced by the diffraction grating 14) and the direction of traveling waves in AOM 17, the above Bragg angle component is defined as follows.

$$\text{Bragg angle component} = \sin 2\Phi_1 \cdot \cos\alpha \tag{36}$$

Accordingly, the pitch $p_G$ of diffraction grating 14 must be $(\cos\alpha)$ times smaller than that in case that the traveling direction of traveling wave in AOM 17 is parallel to the beam split direction. Thus, Equation (8) should be modified as follows.

$$\beta_1=(2v_1 \cdot \cos \alpha)/(P_G f_1) \quad (37)$$

The beams $L_1$ (1) and $L_2$ (−1) modulated by AOM 17 make a flow of interference fringes, which are identical to those obtained by rotating the original diffraction grating by $2\alpha$. Therefore, if the diffraction direction of diffraction grating 14 is parallel to the plane of FIG. 1 and if the traveling direction of traveling wave in AOM 17 is inclined at angle $\alpha$ of 45° to the diffraction direction of diffraction grating 14, the beams $L_1$ (1) and $L_2$ (−1) modulated by AOM 17 will be separated in the direction normal to the plane of FIG. 1. Since these beams $L_1$ (1) and $L_2$ (−1) include no unnecessary beams, the position detection of the diffraction gratings RM and WM can be carried out at extremely high SN ratio.

As seen from Equation (37), the magnification $\beta_1$ of relay optical system (15a, 15b) can be adjusted by changing $\alpha$, that is, by rotating the diffraction grating 14 relative to the AOM 17.

Sixth Embodiment

The sixth embodiment is obtained by modifying the fifth embodiment like the modification from the first embodiment to the second embodiment while adding the same additional members as in the modification. Specifically, the sixth embodiment is constructed as shown in FIG. 22 and is different from the fifth embodiment in that the acoustic signal (SF$_1$) applied to AOM 17 travels in the direction different from the traveling direction of the acoustic signal (SF$_2$) applied to the AOM 60.

Figure 22:
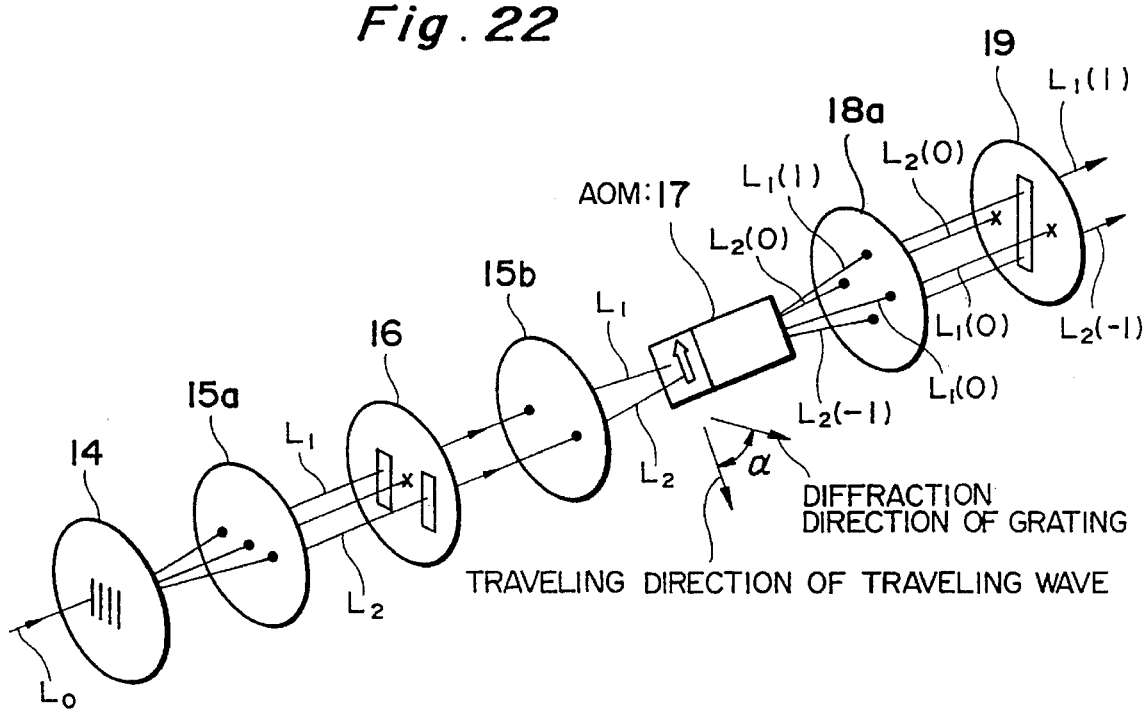
FIG. 22 is a perspective view to show an arrangement of optical members of from diffraction grating 14 to space filter 19.
Figure 23:
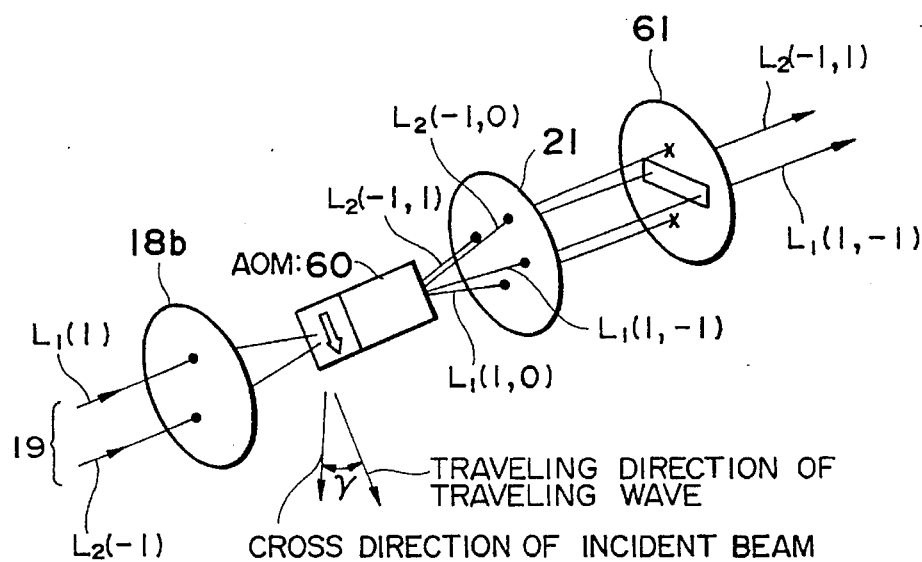
FIG. 23 is a perspective view to show an arrangement of optical members of from relay lens 18b to space filter 61.

In the present embodiment, as shown in FIGS. 22 and 23, the traveling direction of traveling wave in AOM 17 is twisted to the pitch direction of diffraction grating 14 similarly as in the fifth embodiment, and the traveling direction of traveling wave in AOM 17 is also twisted to the traveling direction of traveling wave in AOM 60, whereby mixture of unnecessary noise light is prevented.

FIG. 22 shows the arrangement of optical members from diffraction grating 14 to space filter 19, and FIG. 23 shows the arrangement of optical members from relay lens 18b to space filter 61. The arrangement in FIG. 22 is the same as in the fifth embodiment and is omitted to explain herein.

In FIG. 23, the two ±1st order beams $L_1$ (1) and $L_2$ (−1) leaving the space filter 19 in FIG. 22 include no noise light of other orders, as described in the fifth embodiment. In the present embodiment, the traveling direction of traveling wave in AOM 60 is made different from the cross direction of incident beams, which is a direction normal to the optical axis within a plane including the beams $L_1$ (1) and $L_2$ (−1).

Similarly as in the fifth embodiment, letting the angle be $\gamma$ between the plane including the beams $L_1$ (1) and $L_2$ (−1) and the traveling direction of traveling wave in AOM 60, Equation (19) for magnification $\beta_2$ of second relay optical system (18a, 18b) should be modified as follows.

$$\beta_2=(v_2 f_1 \cos \gamma)/(v_1 f_2) \quad (38)$$

The direction of −1st order diffracted light beam $L_1$ (1, −1) of the beam $L_1$ (1) from AOM 60 is different from the direction of zeroth order diffracted light $L_2$ (−1, 0) of the beam $L_2$ (−1) from AOM 60. Also, the direction of +1st order diffracted light beam $L_2$ (−1, 1) of the beam $L_2$ (−1) from AOM 60 is different from the direction of zeroth order diffracted light $L_1$ (1, 0) of the beam $L_1$ (1) from AOM 60. Thus, the space filter 61 can extract only the beams $L_1$ (1, −1) and $L_2$ (−1, 1). The pitch direction of interference fringes (cross direction) from the beams $L_1$ (1, −1) and $L_2$ (−1, 1) is one obtained by rotating the pitch direction of interference fringes from the incident beams $L_1$ (1) and $L_2$ (−1) by angle $2\gamma$.

Therefore, the pitch direction of interference fringes from the beams $L_1$ (1, −1) and $L_2$ (−1, 1) in FIG. 23 is rotated by angle $2(\alpha+\gamma)$ to the pitch direction of diffraction grating 14 in FIG. 22. If $\alpha=\gamma=45°$ for example, the pitch direction of interference fringes from the beams $L_1$ (1, −1) and $L_2$ (−1, 1).conveniently becomes parallel to the pitch direction of diffraction grating 14.

The present embodiment shows an example in which the two AOMs 17, 60 are arranged in series. In the same manner, n (integer over 2) AOMs may be arranged in series in a general case. Also in such a case, two final beams can be obtained with a desired frequency difference but without unnecessary light by subsequently differing the traveling direction of traveling wave in AOM between adjacent AOMs and removing unnecessary frequency beams by space filters. The other arrangement and the operation of the sixth embodiment are the same as in the fifth embodiment.

Figure 24:
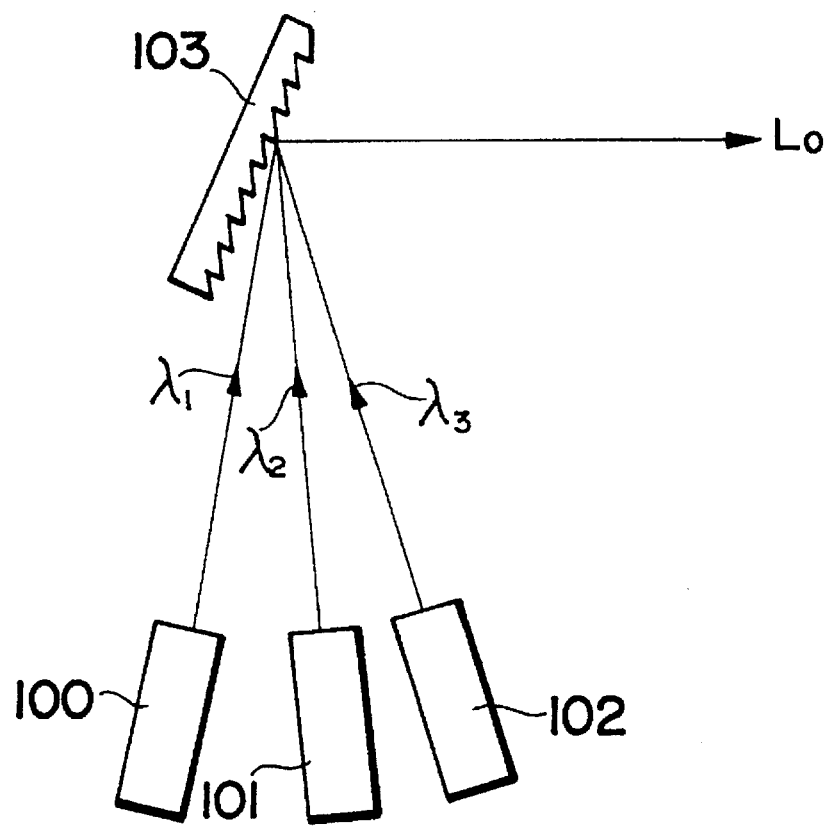
FIG. 24 is a drawing to show an example in which light source means is composed of a plurality of laser sources emitting beams different in wavelength from each other and a blazed diffraction grating.

In the above-described embodiments, the light source means was composed of the white light source 10 such as the Xe lamp and the halogen lamp, the variable aperture 11 and the condenser lens 12, and the white light $L_0$ (multi-wavelength light) from the light source means is guided to impinge normally onto the diffraction grating 14 (beam splitting means) or AOM 17a. The light source means may be one as shown in FIG. 24, in which a plurality of lasers (100, 101, 102) emit beams different in wavelength from each other to irradiate a brazed diffraction grating 103 having a saw tooth section at respective incident angles different from each other, whereby a synthesized beam is obtained from the beams of wavelengths emitted from the lasers (100, 101, 102).

The diffraction grating 14 in the first, the second, the fifth or the sixth embodiment is preferably constructed by a phase-type grating to satisfy following equation (39):

$$d=\lambda(M+0.5)/(n_G-1) \quad (39)$$

where d is a step of the phase-type diffraction grating 14, n is an index of refraction of the diffraction grating 14, $\lambda$ is a wavelength of light and M is an integer. In this arrangement the diffraction efficiency may be remarkably enhanced without production of zeroth order light.

Figure 25:
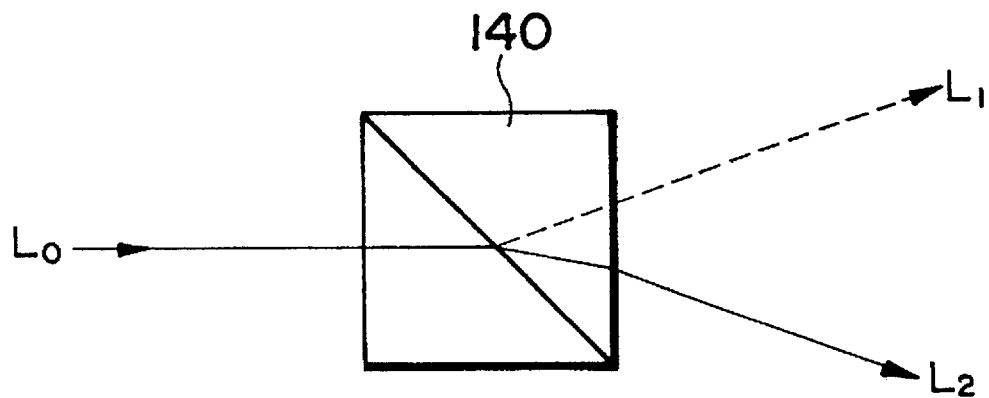
FIG. 25 is a drawing to show an example in which beam splitting means is comprised of a Wollaston prism.
Figure 26:
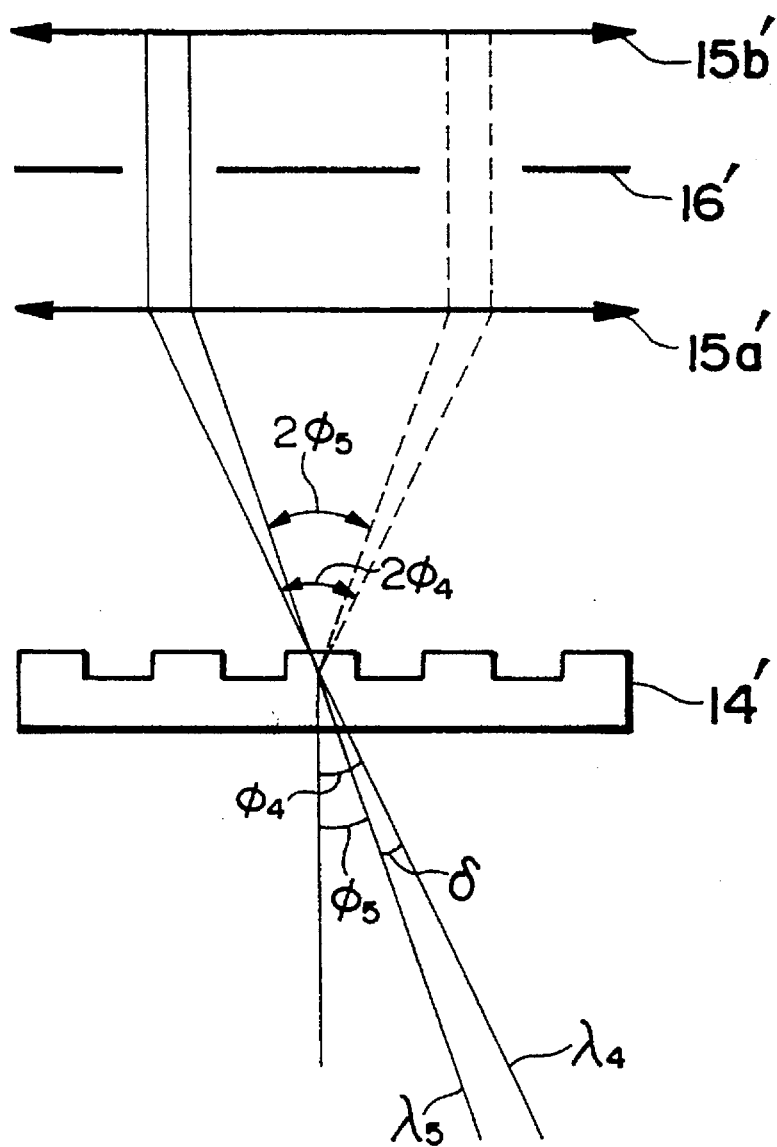
FIG. 26 is an optical path diagram to illustrate another production method of two beams with diffraction grating 14.

Although the above first, second, fifth, or sixth embodiment is so arranged that the white light (multi-wavelength light) supplied from the light source means (10–12) is symmetrically split with respect to the incident direction (direction of optical axis) by the diffraction grating 14 as beam splitting means, beam splitting means other than the diffraction grating 14, for example a Wollaston prism 140 as shown in FIG. 25, may be also employed. Alternatively, a reflection-type diffraction grating may be also employed as the diffraction grating 14.

Also, although each of the above embodiments is so arranged that an optical beat signal extracting portion in phase difference detection system 50 extracts a beat signal of predetermined frequency from each photoelectric signal photoelectrically detected by each detector (25, 33, 36), an optical beat signal extracting portion (Fourier transform circuit) may be provided in an electric path between each detector (25, 33, 36) and the phase difference detection system 50 so that a photoelectric signal photoelectrically detected by each detector (25, 33, 36) is independently Fourier-transformed.

Although the alignment is carried out in each of the above embodiments in the heterodyne interference method utilizing the two beams of ±1st order diffracted light illuminating the alignment marks (RM, WM) in two directions for diffraction, the alignment may also be performed in heterodyne interference method by another arrangement as disclosed for example in Japanese Laid-open Patent Application No. 2-133913, in which the pitch of alignment marks (RM, WM) is a half of that in each embodiment and detection light is a beam of zeroth order light illuminating the alignment marks (RM, WM) and a beam of +2nd order diffracted light (or −2nd order diffracted light) illuminating the alignment marks (RM, WM). Further, the alignment by heterodyne interference method is also possible by the arrangement as disclosed in Japanese Laid-open Patent Application No. 4-7814, in which the detection light is a diffracted light beam appearing in the direction opposite to a first direction in which a first beam illuminates an alignment mark RM on reticle and a diffracted light beam appearing in the direction opposite to a second direction, different from the first direction, in which a second beam illuminates the alignment mark RM on reticle, and in which the two diffracted detection light beams are made interfering with each other by a diffraction grating disposed conjugate with a wafer in alignment optical system so that the interference light is detected by a detector.

Also, in case that the light source is the plural laser sources as shown in FIG. 24, an arrangement may be such that laser beams different in wavelength from each other impinge on a diffraction grating 14' at respective incident angles different from each other and that a space filter 16' extracts zeroth order light and +1st order diffracted light (or −1st order diffracted light).

For example, supposing laser beams of wavelengths $\lambda_4$ and $\lambda_5$ impinge on the diffraction grating 14' at respective incident angles $\Phi_4$ and $\Phi_5$, the incident angles are arranged to satisfy the following equations.

$$\sin(\Phi_4/2) = \lambda_4/P_G'$$

$$\sin(\Phi_5/2) = \lambda_5/P_G'$$

In the equations $P_G'$ represents the pitch of diffraction grating 14'. By this arrangement, there are angles $2\Phi_4$ and $2\Phi_5$ between the zeroth order light beam and the first order diffracted light beam for the respective laser beams as the beams are symmetric with respect to the normal line to the diffraction grating 14'. Since there is no unnecessary light between the laser beams passing through the space filter 16', the assembling precision of space filter 16' may be relaxed as compared with the space filter 16 extracting the ±1st order diffracted light as shown in FIG. 1.

Also, the diffraction grating 14 in the first, second, fifth or sixth embodiment may be replaced by an acousto-optic modulator for effecting the Raman-Nath diffraction.

Figure 27:
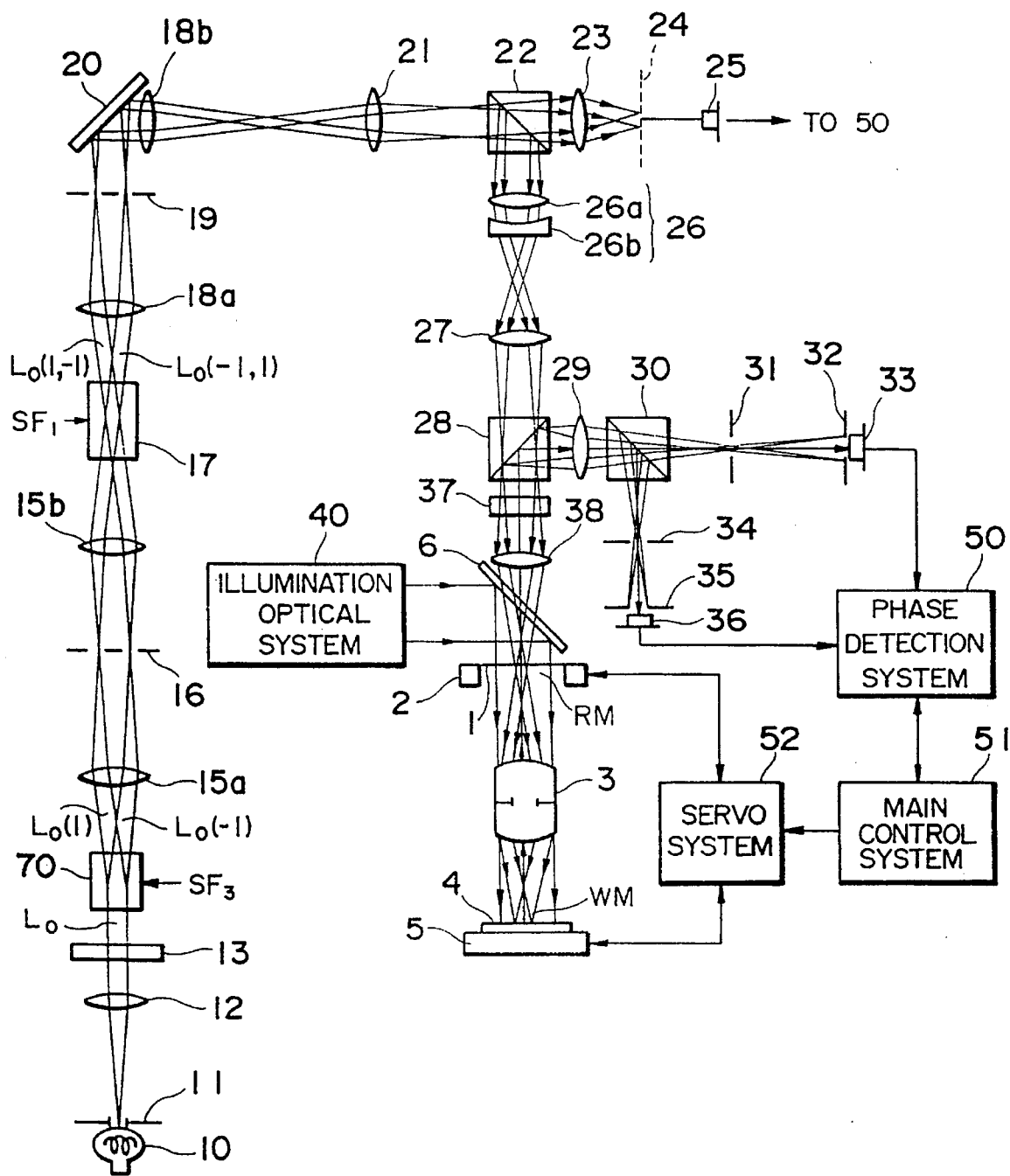
FIG. 27 is a schematic constitutional drawing to show a projection exposure apparatus in a modification of the present invention.

FIG. 27 shows an example in which the diffraction grating 14 in the fifth embodiment as shown in FIG. 1 is replaced by an acousto-optic modulator 70 (as will be referred to as "AOM 70"). In this example, the direction of high-frequency signal $SF_3$ applied to the AOM 70 is opposite to that of high-frequency signal $SF_1$ applied to the AOM 17 so that a finally obtained beat frequency may be lowered (below 1 MHz), facilitating the processing of electric signals. In this example the traveling direction of traveling wave in AOM 70 and the traveling direction of traveling wave in AOM 17 are not parallel to each other, but they are illustrated in parallel in FIG. 28 and FIG. 29 for convenience of description.

FIG. 27 shows the schematic structure of a projection exposure apparatus in this example. In FIG. 27, a beam $L_0$ from white light source 10 is guided to pass through a variable aperture 11, a condenser lens 12 and a band-pass filter 13 then to enter the AOM 70 driven by a high-frequency signal $SF_3$ of frequency $f_3$ in parallel with the wavefront of traveling wave in the AOM. Accordingly, a +1st order diffracted light beam $L_0$ (1) and a −1st order diffracted light beam $L_0$ (−1) are produced by Raman-Nath diffraction from the AOM 70.

After that, the beams $L_0$ (1) and $L_0$ (−1) are guided to pass through a lens 15a, a space filter 16 and a lens 15b then to enter the AOM 17 symmetrically at the same incident angle. A space filter 16 extracts the ±1st order diffracted light $L_0$ (1), $L_0$ (−1) leaving AOM 70. This example is arranged such that the beams $L_0$ (1) and $L_0$ (−1) entering the AOM 17 satisfy the condition of acoustic Bragg diffraction. Since the AOM 17 is driven by a second high-frequency signal $SF_1$ of frequency $f_1$ in the opposite direction to that in AOM 70, −1st order diffracted light $L_0$ (1, −1) (as will be referred to as "beam $L_0$ (1, −1)") form the beam $L_0$ (1) in predetermined wavelength range is frequency-modulated by AOM 17 to have a frequency $(f_0+f_3-f_1) (=F_1)$ and +1st order diffracted light $L_0$ (−1, 1) (as will be referred to as "beam $L_0$ (−1, 1)") from the beam $L_0$ (−1) in predetermined wavelength range is also frequency-modulated by AOM 17 to have a frequency $(f_0-f_3+f_1) (=F_2)$.

Then, the beams $L_0$ (1, −1) and $L_0$ (−1, 1) are guided through a relay optical system (18a, 18b) and a lens 21 and then are respectively split into two by a beam splitter 22. A space filter 19 in relay optical system (18a, 18b) extracts the −1st order diffracted light $L_0$ (1, −1) and the +1st order diffracted light $L_0$ (−1, 1) leaving the AOM 17. The beams thus two-split by the beam splitter 22 are finally photoelectrically detected by the detectors (25, 33, 36) in the same manner as in the fifth embodiment, the details of which are therefore omitted to explain herein.

As described above, this example is so arranged that the two AOMs 70, 17 are arranged in series and that the AOMs are driven by the high-frequency signals $SF_3$ and $SF_1$ opposite to each other, so that the frequency of beat signal photoelectrically detected by each detector (25, 33, 36) may be lowered below 1 MHz, which is easy in signal processing.

Figure 28:
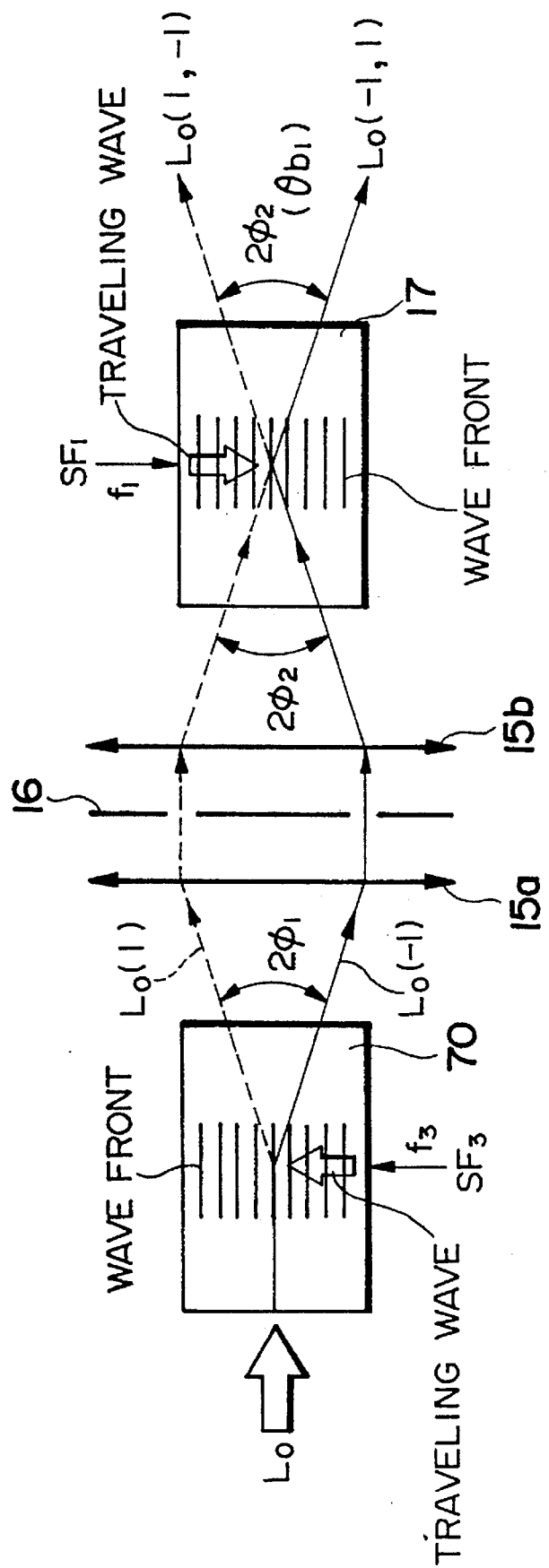
FIG. 28 is a drawing to illustrate the operation of two acousto-optic modulators 70, 17 in the modification.

Next described with FIG. 28 is a more detailed structure of the portion for producing two beams different in frequency from each other in this example shown in FIG. 27.

As shown in FIG. 28, this example is so arranged that the AOM 70 and the AOM 17 are arranged in series and that the relay optical system (15a, 15b) is provided for relaying the diffraction point of AOM 70 (in traveling path of high-frequency signal $SF_3$) to the diffraction point of AOM 17 (in traveling path of high-frequency signal $SF_1$). The beam $L_0$ of white light (multi-wavelength light) enters the AOM 70 in parallel with the wavefront of traveling wave therein and then is subjected to the Raman-Nath diffraction by AOM 70.

If N-th diffracted light from incident light of wavelength $\lambda$ has a diffraction angle $\Phi_1$ and if the pitch of traveling wave in AOM 70 is $\Lambda_3$, the following equation holds.

$$\sin \Phi_1 = N\lambda/\Lambda_3 \tag{40}$$

For the pitch $\Lambda_3$ of traveling wave, the following equation stands with velocity $v_3$ and frequency $f_3$ of traveling wave.

$$\Lambda_3 = v_3/f_3 \tag{41}$$

Accordingly, Equation (40) may be rewritten as follows for ±1st order diffracted light.

$$\sin \Phi_1 = f_3 \lambda / v_3 \qquad (42)$$

Now discussed is the diffraction angle of ±1st order light $L_0$ (1), $L_0$ (−1) passing through the space filter 16 in FIG. 28. For example, suppose the base wavelength $\lambda_0$ of irradiation light is 633 nm, the width of wavelength band is ±50 nm, and the pitch $\Lambda_3$ of traveling wave in AOM 70 is 40 µm. The diffraction angle of ±1st order light is 0.835° for shortest wavelength of 583 nm and 0.978° for longest wavelength of 683 nm. Accordingly, with incident light of 583–683 nm the diffraction angle of ±1st order light is distributed within a range of 0.835°–0.978°. Since the beams are diffracted by the traveling wave in AOM 70, the diffracted light is frequency-modulated therein by the frequency of traveling wave.

Also, it is found that the optical frequency modulation by the Raman-Nath diffraction is irrespective of the wavelength of incident beam, similarly as in the Bragg diffraction, in which the +1st order diffracted light is frequency-modulated by an amount of $+f_3$ and the −1st diffracted light is frequency-modulated by an amount of $-f_3$. If the ±1st order diffracted light is utilized in this example, +1st order diffracted light $L_0$ (1) (as will be also referred to as "beam $L_0$ (1)") and −1st order diffracted light $L_0$ (−1) (as will be also referred to as "beam $L_0$ (−1)") leave the AOM 70 symmetrically with respect to the optical axis of incident light, and the beams $L_0$ (1) and $L_0$ (−1) are frequency-modulated by the AOM 70 to have frequencies $(f_0+f_1)$ and $(f_0-f_1)$, respectively.

The beams $L_0$ (1) and $L_0$ (−1), which are frequency-modulated by AOM 70 to have the frequencies $(f_0+f_3)$ and $(f_0-f_3)$, are inclined symmetrically at angle $\Phi_1$ with respect to the optical axis of incident light, leaving the AOM 70 symmetrically with respect to the wavefront of traveling wave. Then, the beams $L_0$ (1) and $L_0$ (−1) are condensed by the relay optical system (15a, 15b) to enter the AOM 17 symmetrically at angle $\Phi_3$ with respect to the direction of optical axis. −1st order diffracted light $L_0$ (1, −1) from the beam $L_0$ (1) is frequency-modulated there to have a frequency $(f_0+f_3-f_1)$ $(=F_1)$, while +1st order diffracted light $L_0$ (−1, 1) from the beam $L_0$ (−1) is frequency-modulated to have a frequency $(f_0-f_3+f_1)$ $(=F_2)$. The beams $L_0$ (1, −1) and $L_0$ (−1, 1) leave the AOM 17 symmetrically at angle $\Phi_3$ equal to the incident angle $\Phi_3$. In other words, the beams $L_0$ (1, −1) and $L_0$ (−1, 1) are diffracted in acoustic Bragg diffraction by the AOM 17.

With diffraction angle by acoustic Bragg diffraction of AOM 17 being $\theta_{b1}$ $(=2\Phi_3)$, velocity of ultrasonic wave (traveling wave crossing the AOM 17 being $v_1$, ultrasonic wave frequency of high-frequency signal $SF_1$ being $f_1$, wavelength of light being $\lambda$, and wavelength of ultrasonic wave (traveling wave) crossing the AOM 17 being $\Lambda_1$, Equations (4) to (6) in the first embodiment hold. As for the magnification $\beta_1$ of relay optical system (15a, 15b), the relation of Equation (8) in the first embodiment also holds. In detail, the magnification $\beta_1$ of relay optical system (15a, 15b) is expressed by Equation (43).

$$\beta_1 = 2 \cdot f_3 v_1 / (f_1 v_3) \qquad (43)$$

If the two AOMs (70, 17) are made of the same material and if the frequency difference is of several ten KHz between the third and the first high-frequency signals $(f_3, f_1)$, $\beta_1$ in equation (43) becomes nearly equal to 2. Thus, the relay optical system (15a, 15b) may be constructed to have the magnification $\beta_1$ equal to 2.

In the arrangement of FIG. 28, however, zeroth order light from the beam $L_0$ (1) is mixed in the beam $L_0$ (1, −1) leaving the AOM 17, and zeroth order light from the beam $L_0$ (1) is mixed in the beam $L_0$ (−1, 1). In order to avoid the mixture, the present example is so arranged, as shown in FIG. 29, that the traveling direction of traveling wave in front AOM 70 is made different from the traveling direction of traveling wave in rear AOM 17.

Figure 29:
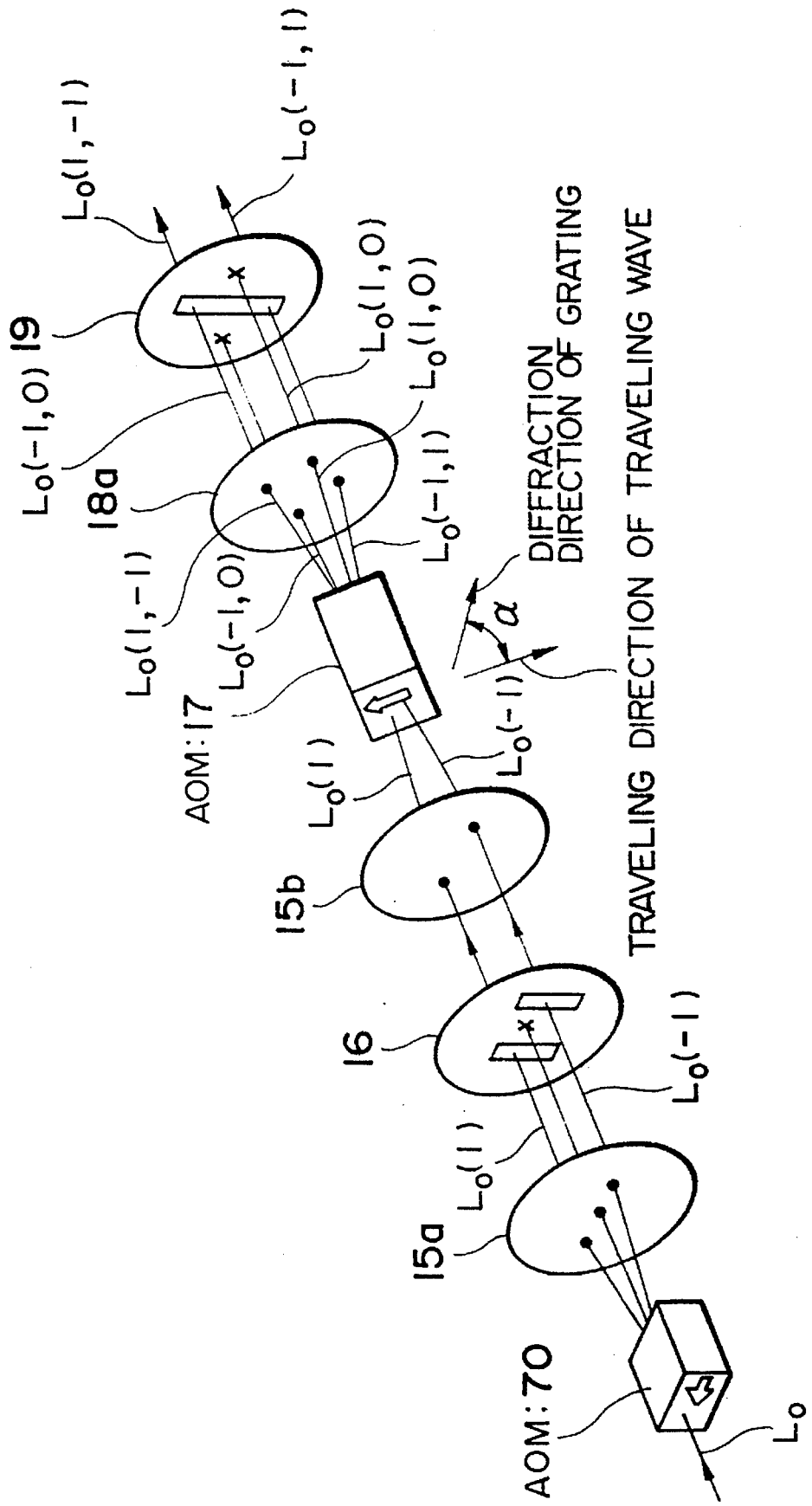
FIG. 29 is a perspective view to show an arrangement of optical members of from AOM 70 to space filter 19.

FIG. 29 shows the actual arrangement of optical members from front AOM 70 to space filter 19 shown in FIG. 27. In FIG. 29, the traveling direction of traveling wave of front AOM 70 is intersecting at angle $\alpha$ with the traveling direction of traveling wave of rear AOM 17. Accordingly, the −1st order diffracted light $L_0$ (1, −1) leaving the rear AOM 17 is separated from the zeroth order light $L_0$ (−1, 0) of the beam $L_e$ (−1) while the +1st order diffracted light $L_0$ (−1, 1) leaving the AOM 17 is separated from the zeroth order light $L_0$ (1, 0) of the beam $L_0$ (1). Then, the space filter 19 can extract only the beams $L_0$ (1, −1) and $L_0$ (−1, 1), which remarkably improves the SN ratio of detection signals.

The pitch $\Lambda_3$ of traveling wave in front AOM 70 is (cos $\alpha$) times smaller than that in case that the traveling directions of traveling waves in AOM 70 and AOM 17 are parallel to each other, similarly as in the fifth embodiment. The magnification $\beta_1$ of relay optical system (15a, 15b) is given for this arrangement by Equation (44).

$$\beta_1 = 2 \cdot \cos \alpha \cdot f_3 v_1 / (f_1 v_3) \qquad (44)$$

In the present embodiment, at least one of front AOM 70 and rear AOM 17 is rotated to the other so that the traveling direction of traveling wave crossing the front AOM 70 is made different from the traveling direction of traveling wave in rear AOM 17, whereby unnecessary diffracted light may be surely optically removed. Since the front AOM 70 utilizes the Raman-Nath diffraction, the two functions of beam separation and provision of frequency difference between the separate beams are achieved by a single AOM 70, whereby the structure of apparatus may be simplified.

As seen from Equation (37), the magnification $\beta_1$ of relay optical system (15a, 15b) may be adjusted by changing $\alpha$, or by rotating the AOM 70 relative to AOM 17.

Further, two beams symmetrically enter and leave each of two AOMs 70, 17, so that even if light including plural wavelengths is used for such beams, a difference of optical path length between the beams is very small when they finally impinge on the diffraction grating marks RM, WM, whereby the position detection may be well conducted. Therefore, the high-precision alignment can be achieved in heterodyne interference method while suppressing the influence of asymmetry of diffraction grating mark by averaging effect of beat light signals of some wavelengths and the influence of thin film interference of resist (influence of change in light quantity) with multi-wavelength light.

The acousto-optic elements (AOM 17, AOM 60) effecting the Bragg diffraction in the first, second, fifth and sixth embodiments may be replaced by another means.

Figure 30:
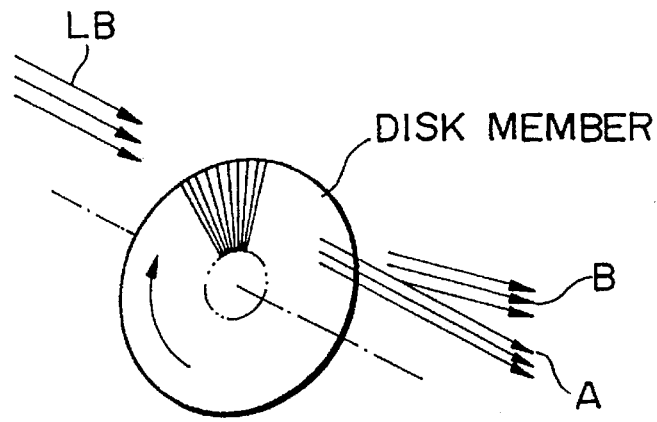
FIG. 30 is an explanatory view to illustrate a radial grating.

FIG. 30 shows a so-called radial grating as an alternative, in which transparent portions and shielding portions are alternately formed at a certain pitch on a disk, which is mechanically rotated through an unrepresented drive system.

Figure 31:
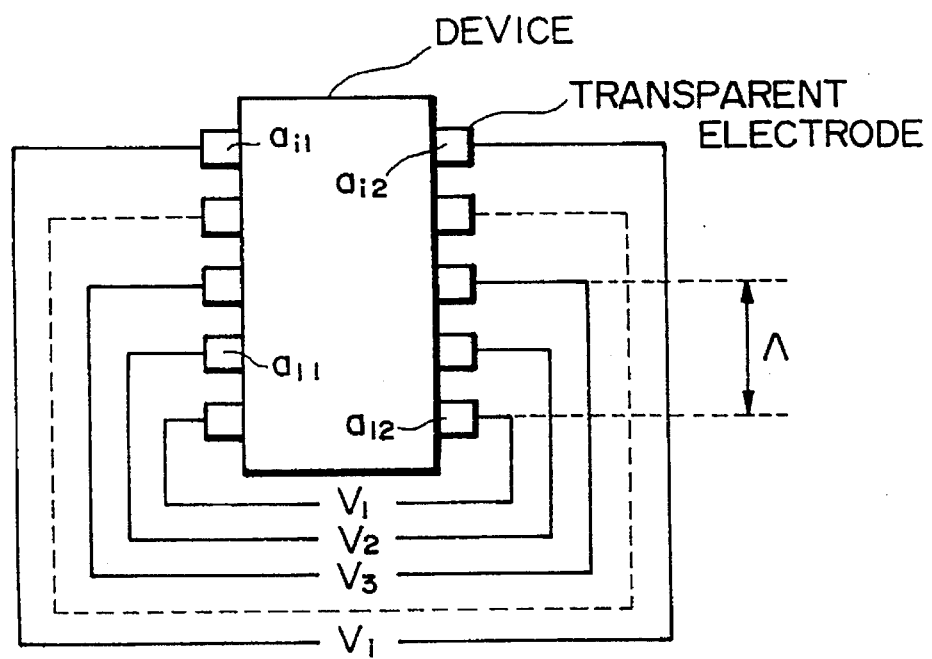
FIG. 31 is an explanatory drawing to illustrate an example of formation of diffraction grating by voltage application.

FIG. 31 shows another alternative, in which on a device changing its index of refraction by voltage application (e.g., electro-optic modulators, photochromic devices, liquid crystal devices, etc.) transparent electrodes are juxtaposed as opposing to each other on either side of the device and in which the electrodes are sequentially driven. FIG. 31 shows an example in which three sets of transparent electrodes correspond to a pitch of fringes (at least three sets of electrodes are theoretically necessary for fringe formation) and in which the electrodes are arranged at equal intervals such that a distance between the three sets of transparent electrodes corresponds to a pitch of fringes.

In this arrangement, a drive voltage of i-th transparent electrodes ($a_{i1}$, $a_{i2}$) is as follows:

$v_i = v_0 \cos[2\pi(f+i/3)t]$, where i: order of arrangement of electrode pair in set, $v_i$: drive voltage, $v_0$: base voltage, f: drive frequency, t: time.

In case that the transparent electrodes are arranged such that N sets of transparent electrodes corresponds to a pitch of fringes, a drive voltage of i-th transparent electrodes ($a_{i1}$, $a_{i2}$) is as follows:

$v_i = v_0 \cos[2\pi(f+i/N)t]$, where i: order of arrangement of electrode pair in set, $v_i$: drive voltage, $v_0$: base voltage, f: drive frequency, t: time.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A double-beam light source apparatus comprising:

a light source system for supplying a beam; and a frequency difference producing system disposed in an optical path of the beam outgoing from said light source system to split it into two beams, that produces a predetermined frequency difference between said two beams to output said two beams radially spreading, the frequency difference producing system comprising an acousto-optic modulator, which effects Raman-Nath diffraction on an incident beam by a diffraction grating pattern formed by a compressional wave applied to said acousto-optic modulator, whereby the incident beam is split into two beams radially spreading from a predetermined position and a frequency of each of said two split beams is changed in accordance with an outgoing direction thereof, wherein transmission optical path lengths of the two beams are identical to each other and the two beams having said predetermined frequency difference are made separately outgoing.

2. A double-beam light source apparatus according to claim 1, wherein said light source system comprises a light source emitting a beam of single wavelength and a condensing optical unit for condensing the beam from said light source.

3. A double-beam light source apparatus according to claim 1, wherein said light source system comprises a light source for generating a beam including light of plural wavelengths and a condensing optical unit for condensing the beam from said light source.

4. A double-beam light source apparatus according to claim 1, wherein said compressional wave applied to said acousto-optic modulator travels in a direction approximately normal to an incident direction of the beam incident into said acousto-optic modulator.

5. A double-beam light source apparatus according to claim 1, further comprising optical unit for collimating said two radially spreading beams outgoing from said frequency difference producing system.

6. A position detecting apparatus comprising:

a double-beam light source apparatus comprising:

a light source system for supplying a beam; and a frequency difference producing system disposed in an optical path of the beam outgoing from said light source system to split it into two beams, that produces a predetermined frequency difference between said two beams to output said two beams radially spreading, in which transmission optical path lengths of the two beams are identical to each other and the two beams having said predetermined frequency difference are made separately outgoing, the frequency difference producing system comprising an acousto-optic modulator, which effects Raman-Nath diffraction on an incident beam by a diffraction grating pattern formed by a compressional wave applied to said acousto-optic modulator, whereby the incident beam is split into two beams radially spreading from a predetermined position and a frequency of each of said two split beams is changed in accordance with an outgoing direction thereof;

a light separating unit for separating the two beams outgoing from said double-beam light source apparatus into two sets of double beams;

a first condensing system for receiving a set of double beams outgoing from said light separating unit and for condensing the set of double beams at a reference diffraction grating;

a first photodetector for detecting an optical information resulting from diffraction by said reference diffraction grating;

a second condensing system for receiving the other set of double beams outgoing from said light separating unit and for condensing the other set of double beams at a diffraction grating formed on an object to be measured;

a second photodetector for detecting an optical information resulting from diffraction by said diffraction grating formed on said object to be measured; and an optical information processing system for receiving an output signal of said first photodetector and an output signal of said second photodetector to compare the both optical information with each other and for calculating a displacement amount of said object to be measured from a reference position.

7. A position detecting apparatus according to claim 6, wherein said light source system comprises a light source emitting a beam of single wavelength and a condensing optical unit for condensing the beam from said light source.

8. A position detecting apparatus according to claim 6, wherein said light source system comprises a light source emitting a beam including light of plural wavelengths and a condensing optical unit for condensing the beam from said light source.

9. A position detecting apparatus according to claim 6, wherein said compressional wave applied to said acousto-optic modulator travels in a direction approximately normal to an incident direction of the beam incident into said acousto-optic modulator.

10. A position detecting apparatus according to claim 6, further comprising:

a third condensing system for receiving two diverging beams after condensed by said second condensing system and for re-condensing the two diverging beams at a diffraction grating formed on a second object to be measured; and a third photodetector for detecting an optical information resulting from diffraction by said diffraction grating formed on said second object to be measured;

wherein said optical information processing system receives an output signal of said third photodetector in addition to the output signals of said first and second photodetectors to obtain a relative positional deviation between a position of said first object to be measured and a position of said second object to be measured.

11. An aligning apparatus comprising:

a position detecting apparatus as set forth in claim 10;

a first drive unit for said first object to be measured; and a second drive unit for said second object to be measured;

wherein said aligning apparatus performs alignment by adjusting the positional deviation between said objects to be measured.

12. An exposure apparatus comprising:

an illumination optical system for illuminating an exposure light on a mask to replicate a predetermined pattern formed on said mask onto a substrate;

a position detecting system for optically detecting positions of said mask and said substrate, respectively;

a calculating unit for calculating relative displacement between said mask and said substrate based on an output from said position detecting system; and a driving unit for relatively moving said mask and said substrate based on an output from said calculating unit, said position detecting system comprising:

(a) a double-beam light source apparatus comprising:
 (i) a light source system for supplying a beam; and
 (ii) a frequency difference producing system disposed on an optical path of the beam outgoing from said light source system to split it into two beams, that produces a predetermined frequency difference between said two beams to output said two beams radially spreading, in which transmission optical path lengths of the two beams are identical to each other and the two beams having said predetermined frequency difference are made separately outgoing, the frequency difference producing system comprising an acousto-optic modulator, which effects Raman-Nath diffraction on an incident beam by a diffraction grating pattern formed by a compressional wave applied to said acousto-optic modulator, whereby the incident beam is split into two beams radially spreading from a predetermined position and a frequency of each of said two split beams is changed in accordance with an outgoing direction thereof;

(b) a first optical condensing system for respectively condensing two beams output from said double-beam light source apparatus on diffraction grating marks respectively formed on said mask and said substrate;

(c) a first photodetector for detecting a light grated by said diffraction grating formed on said substrate to output a first detection signal to said calculating unit; and (d) a second photodetector for detecting a light grated by said diffraction grating formed on said mask to output a second detection signal to said calculating unit.

13. An exposure apparatus according to claim 12, further comprising a projection optical system for projecting said predetermined pattern on said mask on said substrate with a predetermined magnification.

14. An exposure apparatus according to claim 12, wherein said position detecting system further comprises:

a beam splitting unit for splitting the two beams output from said double-beam light source apparatus into two light beam sets;

a second optical condensing system for receiving two beams in one of the two light beam sets which are split by said beam splitting unit, and for condensing said two beams at a standard detraction grating; and a third photo-detector for detecting a light grated in said standard detraction grating to output a third detection signal to said calculating unit.

15. An exposure apparatus according to claim 12, wherein said driving means comprises:

mask holding units for holding said mask; and a substrate holding unit for holding said substrate, either one of said mask holding units and said substrate holding unit being moved based on an output from said driving unit.

16. An exposure apparatus according to claim 12, wherein said light source system comprises a light source emitting a beam of single wavelength and a condensing optical unit for condensing the beam from said light source.

17. An exposure apparatus according to claim 12, wherein said light source system comprises a light source emitting a beam including light of plural wavelengths and a condensing optical unit for condensing the beam from said light source.

18. An exposure apparatus according to claim 12, wherein said compressional wave applied to said acousto-optic modulator travels in a direction approximately normal to an incident direction of said beam incident into said acousto-optic modulator.

\* \* \* \* \*